United States Patent
Shinkawa et al.

(10) Patent No.: US 6,944,723 B2
(45) Date of Patent: Sep. 13, 2005

(54) DATA PROCESSING DEVICE FOR PROCESSING DATA ACCESSED BY A BUFFER MANAGER, AND INTERFACE DEVICE

(75) Inventors: Takayuki Shinkawa, Kawasaki (JP); Yasunori Izumiya, Kawasaki (JP); Masakazu Kawamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 253 days.

(21) Appl. No.: 09/993,729

(22) Filed: Nov. 6, 2001

(65) Prior Publication Data

US 2002/0124146 A1 Sep. 5, 2002

(30) Foreign Application Priority Data

Mar. 2, 2001 (JP) ........................................ 2001-059283

(51) Int. Cl.[7] .............................................. G06F 13/00
(52) U.S. Cl. ...................... 711/151; 711/147; 711/152; 711/158; 710/14; 710/23
(58) Field of Search ............................... 710/10, 23, 8, 710/14; 711/8, 147, 152, 151

(56) References Cited

U.S. PATENT DOCUMENTS

| | | | | |
|---|---|---|---|---|
| 4,777,355 A | * | 10/1988 | Takahira ..................... | 235/380 |
| 4,958,276 A | * | 9/1990 | Kiuchi et al. ............... | 711/167 |
| 6,189,053 B1 | * | 2/2001 | Yasue et al. .................. | 710/52 |
| 6,272,589 B1 | * | 8/2001 | Aoki .......................... | 711/112 |
| 6,487,126 B1 | * | 11/2002 | Kawahara ............... | 365/189.05 |
| 6,643,725 B1 | * | 11/2003 | Kozakai et al. ............. | 710/300 |
| 6,654,646 B2 | * | 11/2003 | Bowers et al. ................. | 700/5 |

FOREIGN PATENT DOCUMENTS

| | | |
|---|---|---|
| JP | 56-127262 | 10/1981 |
| JP | 59-175133 | 10/1984 |
| JP | 2-010175 | 1/1990 |
| JP | 3-115873 | 5/1991 |
| JP | 6-124175 | 5/1994 |
| JP | 6-149482 | 5/1994 |
| JP | 10-187359 | 7/1998 |

* cited by examiner

Primary Examiner—Reba I. Elmore
(74) Attorney, Agent, or Firm—Greer, Burns & Crain, Ltd.

(57) ABSTRACT

In a data processing device, a processor processes data based on a stored program and a buffer manager accesses the data. The data processing device includes a program memory which stores program codes, the program codes being loaded into the program memory and executed by the processor when processing the data. A shared memory stores one of the program codes and the data. A control unit selectively connects one of the processor and the buffer manager to the shared memory based on a select pattern, wherein the shared memory functions to store the program codes when the select pattern is set in a first condition, and the shared memory functions to store the data when the select pattern is set in a second condition.

7 Claims, 19 Drawing Sheets

FIG.12

| PHYSIBAL ADDRESS ON DISK (CYL, HEAD, SECTOR) | UPDATE FLAGS | | | | ACCESS-DISABLE FLAGS | | | | CHA BUF ADDR | CHB BUF ADDR |
|---|---|---|---|---|---|---|---|---|---|---|
| | WR-BK FLG | | STG FLAG | | CPY-ST FLAG | | ACT-ST FLAG | | | |
| | CHA | CHAB | CHA | CHAB | B→A | A→B | CHA | CHB | | |
| 100,1,0 | 1 | 0 | 0 | 0 | 0 | 0 | 0 | 0 | 00AA00h | 00AA00h |
| | | | | | | | | | | |
| | | | | | | | | | | |
| | | | | | | | | | | |
| | | | | | | | | | | |

DATA PROCESSING DEVICE FOR PROCESSING DATA ACCESSED BY A BUFFER MANAGER, AND INTERFACE DEVICE

BACKGROUND OF THE INVENTION

1. Field of the Invention

The present invention generally relates to a data processing device, a signal processing device and an interface device. More particularly, the present invention relates to a data processing device that performs data input/output operations based on a stored program of a hard disk drive, and the present invention also relates to a signal processing device that selectively outputs one of testing signals of an internal logic circuit of a hard disk drive, and further the present invention relates to an interface device that performs data input/output operations in a hard disk drive via a plurality of channels.

2. Description of the Related Art

FIG. 1 shows a configuration of a hard disk drive.

As shown in FIG. 1, the hard disk drive 1 generally includes an enclosure 2 and a circuit board 3. In the enclosure 2, a disk 11, a spindle motor (SPM) 12, a magnetic head 13, a voice coil motor (VCM) 14, and a head IC (HDIC) 15 are provided. The disk 11 is rotated by the spindle motor 12. The head 13 is placed on the surface of the disk 11 such that the head 13 confronts the disk surface. The head 13 is attached to the voice coil motor 14, and the head 13 is movable in a radial direction of the disk 11 by the voice coil motor 14. The head 13 magnetizes the disk 11 in accordance with writing information. The head 13 outputs a signal indicative of the magnetized condition of the disk 11 to the head IC 15.

In the hard disk drive 1 of FIG. 1, the spindle motor 12 is rotated in response to a rotation control signal supplied from the circuit board 3. The voice coil motor 14 is actuated in response to a position control signal supplied from the circuit board 3, and the voice coil motor 14 performs the positioning of the head 13 relative to the disk 11. The head 13 magnetizes the disk 11 in accordance with writing information sent from the circuit board 3, and the head 13 sends a read-out signal to the head IC 15, the read-out signal being produced from the disk 11 in response to the magnetized condition of the disk 11. The head IC 15 amplifies the writing signal, sent by the circuit board 3, and sends the amplified writing signal to the head 13. The head IC 15 amplifies the read-out signal, sent by the head 13, and sends the amplified read-out signal to the circuit board 3.

In the hard disk drive 1 of FIG. 1, the circuit board 3 generally includes a read channel 21, a hard disk controller (HDC) 22, a buffer memory 23, a servo controller 24, and a ROM (read-only memory) 25. The read channel 21 generates a writing signal based on writing information from the hard disk controller 22, and generates a read-out data based on the read-out signal sent from the head 13. Moreover, the read channel 21 extracts a servo signal from the read-out signal sent from the head 13, and sends the servo signal to the servo controller 24.

The servo controller 24 controls the rotation of the spindle motor 12 and the actuation of the voice coil motor 14 based on the servo signal from the read channel 21. The ROM 25 stores, in advance, the program codes (or the firmware) that are executed by a processor of the hard disk controller 22. When the hard disk drive is powered on, the program codes of the ROM 25 are loaded to the internal memory of the hard disk controller 22, and the program codes are executed by the processor of the hard disk controller 22.

FIG. 2 shows a configuration of a conventional hard disk controller for use in the hard disk drive.

As shown in FIG. 2, the conventional hard disk controller 22 generally includes an interface unit 31, a buffer manager 32, a disk formatter 33, a processor 34, and a program memory 35. The elements 31 to 35 of the hard disk controller 22 are interconnected by a bus as indicated in FIG. 2.

In the conventional hard disk controller 22, the interface unit 31 provides the interface between the hard disk controller 22 and a host computer 41 when receiving writing data from the host computer 41. The buffer manager 32 temporarily stores the writing data, received from the host computer 41, into the buffer memory 23. The buffer manager 32 reads the writing data from the buffer memory 23 and delivers the writing data to the disk formatter 33, based on the command from the processor 34. The disk formatter 33 formats the writing data of the buffer memory 23 in a predetermined format and delivers the formatted writing data to the read channel 21 based on the command from the processor 34.

Further, in the conventional hard disk controller 22, the read-out data from the read channel 21 is received at the disk formatter 33, and the disk formatter 33 reconstructs the read-out data in the original format and delivers the resulting read-out data to the buffer manager 32. The buffer manager 32 stores the read-out data, received from the disk formatter 33, into the buffer memory 23. The buffer manager 32 reads the read-out data from the buffer memory 23 and delivers the read-out data to the host computer 41 via the interface unit 31 based on the command from the processor 34.

In the conventional hard disk controller 22, the processor 34 executes the program codes of the firmware that are loaded from the ROM 25 into the program memory 35. Hence, the conventional hard disk controller 22 is required to load the program codes of the firmware from the ROM 25 into the program memory 35 in order to allow the processor 34 to execute the program codes of the firmware. Further, the conventional hard disk controller 22 is required that the buffer memory 23 be externally connected to the conventional hard disk controller 22 in order to allow the buffer memory 23 to temporarily store the writing data or the read-out data.

Generally, the firmware stored in the conventional hard disk controller 22 may be classified into two categories: the firmware with high-level functions and the firmware with low-level functions. The number of processing steps and the number of usable parameters included in the firmware with high-level functions are larger than those in the firmware with low-level functions. With the use of the firmware with high-level functions, the hard disk drive can be controlled so as to achieve the high-level functions of the hard disk drive. In addition, the number of processing steps and the number of usable parameters included in the firmware with low-level functions are smaller than those in the firmware with high-level functions. When the firmware with low-level functions is stored in the conventional hard disk controller 22, the processing steps can be executed with relatively low cost.

The hard disk controller 22 including the program memory 35 is usually constructed into a single chip. Generally, when an internal memory is included in a multi-function LSI, the area of the memory included in the chip is large, and the area of the entire chip is increased. This is detrimental to the construction of smaller-size chip, or the yield is lowered. For this reason, it is required to make the amount of storage of the memory at the necessary, minimum level.

Conventionally, the hard disk controller including the firmware with high-level functions and the hardware including the firmware with low-level functions are provided with the internal memories with different amounts of storage. By using such configuration, the amount of storage of the internal memories is made at the necessary, minimum level, thereby preventing the construction of a large-size chip.

The conventional hard disk controller 22 shown in FIG. 2 is provided for use in the hard disk drive. In the case of the conventional hard disk controller 22, the chip containing the firmware with high-level functions and the chip containing the firmware with low-level functions are separately designed and developed. For this reason, the manufacturing cost is considerably increased.

Next, a description will be given of a method of testing an LSI for use in the hard disk drive.

FIG. 3 shows a configuration of an LSI which is provided in the hard disk drive. As shown in FIG. 3, the conventional LSI 50 generally includes an internal logic circuit 51 and a multiplexer 52. The internal logic circuit 51 performs a given logic operation for input signals that are received from input terminals "Tin 1" through "Tin n" of the LSI 50, and outputs the processed signals to output terminals "Tout 1" through "Tout m" of the LSI 50, respectively. The internal logic circuit 51 is comprised of a plurality of blocks (#1 through #p), and the respective testing signals from the blocks #1 through #p of the internal logic circuit 51 are transferred to the multiplexer 52. A select pattern of "p" select signals that are received from test select terminals "Ts1" through "Tsp" of the LSI 50 is supplied to the multiplexer 52. The multiplexer 52 selects one of the testing signals from the blocks #1 through #p of the internal logic circuit 51 based on the select pattern from the test select terminals "Ts1" through "Tsp", and sends the selected testing signal to a test output terminal "Ttout" of the LSI 50.

FIG. 4 is a time chart for explaining operation of the conventional LSI 50 during a test. In FIG. 4, (A) indicates an internal clock of the LSI 50, (B) indicates an output signal of the block #3, (C) indicates an output signal of the block #5, (D) indicates the select pattern, and (E) indicates an output signal of the test output terminal "Ttout".

As indicated in FIG. 4(A), the respective signals from the blocks #1 through #p of the internal logic circuit 51 are output synchronously with the rising edge of the internal clock. As indicated in FIG. 4(D), at time "t1" the select pattern from the test select terminals "Ts1" through "Tsp", which indicates the selection to select the block #3 signal, is input to the multiplexer 52. At time "t2", which matches with the time of the following rising edge of the internal clock, the multiplexer 51 outputs the block #3 signal to the test output terminal "Ttout", as indicated in FIG. 4(E), based on the select signal. The block #3 signal, output to the test output terminal "Ttout" at this time, is the same as the block #3 signal indicated in FIG. 4 (B).

Further, at time "t3" the select pattern from the test select terminals "Ts1" through "Tsp", which indicates the selection to select the block #5 signal, is input to the multiplexer 52, as indicated in FIG. 4(D). At time "t4", which matches with the time of the following rising edge of the internal clock, the multiplexer 51 outputs the block #5 signal to the test output terminal "Ttout", as indicated in FIG. 4(E), based on the select signal. The block #5 signal, output to the test output terminal "Ttout" at this time, is the same as the block #5 signal indicated in FIG. 4(C).

As described above, in the conventional LSI testing method, the selected testing signal, which is selected from among the respective testing signals of the internal logic circuit 51 based on the select pattern from the test select terminals of the LSI 50, is output to the test output terminal "Ttout".

In the above-described LSI testing method, the select pattern sent from the test select terminals of the LSI 50 must be provided to indicate all of the testing signals of the blocks of the internal logic circuit 51 for outputting the selected testing signal to the test output terminal. The LSI 50 requires a large number of the test select terminals for the testing of the internal logic circuit 51. This is detrimental to the construction of smaller-size chip.

Next, a description will be given of a method of data transfer of a conventional interface device.

FIG. 5 shows a configuration of an interface device for use in the hard disk drive. As shown in FIG. 5, the conventional interface device 60 generally includes an interface circuit (IF A) 61, an interface circuit (IF B) 62, a data buffer memory 63, a buffer controller 64, and a hard disk controller (HDC) 65.

In the conventional interface device 60, the interface circuit 61 provides the interface between the hard disk drive and a computer A, and the interface circuit 62 provides the interface between the hard disk drive and a computer B. The buffer controller 64 stores the input data, received from the interface circuit 61 or the interface circuit 62, into the data buffer memory 63. The buffer controller 64 reads data, which is to be recorded to the magnetic disk 11, from the data buffer memory 63, and transmits the data to the magnetic head 13 through the HDC 65. The data is recorded to the disk 11 by means of the head 13.

Further, in the conventional interface device 60, the read-out signal, which is output by the head 13 of the hard disk drive when reading data from the disk 11, is received at the HDC 65. The HDC 65 produces the read-out data from the received read-out signal, and sends the read-out data to the buffer controller 64. The buffer controller 64 temporarily stores the read-out data, which is received from the HDC 65, into the data buffer memory 63. The buffer controller 64 sends the read-out data, read from the data buffer memory 63, to one of the computers A and B via one of the interface circuits 61 and 62.

In the conventional interface device 60, the interface circuit 61 and the interface circuit 62 share the data buffer memory 63, and the interface that can operate simultaneously is restricted by the data transfer capacity of the data buffer memory 63. For example, suppose that the data transfer capacity of the buffer memory 63 is 350 MB/s, and the data transfer capacity of each of the interface circuits 61 and 62 is 200 MB/s. In such a case, when one of the interface circuits 61 and 62 operates to transfer the data from the data buffer memory 63 to one of the computers A and B, the other interface circuit does not operate due to the data transfer capacity of the data buffer memory 63 and is set in a waiting condition until the data transfer of the former interface circuit is done. Hence, because of the data transfer capacity of the buffer memory 63, it is difficult for the conventional interface device 60 to simultaneously carry out the data reading/writing operations with the buffer memory 63.

The commands from the computer A or the computer B are linked to the command queue in the interface circuit 61 or the interface circuit 62, and retained in the interface circuit 61 or the interface circuit 62. The incoming commands are linked to the command queue in order of their arrivals, and the commands in the command queue are re-ordered such that the movement of the head 13 needed to execute each command is minimized. The re-ordering of the commands is performed such that, when the write command and the read command are related to the same sector of the disk 11, the write command is set at a preceding position of the command queue and the read command is set at a following position of the command queue. If the write command is set at a position of the command queue following the position of the read command by the re-ordering, the read command is executed at a too early time, and the non-updated data before the writing data is recorded to the disk 11 is improperly read from the disk 11 by the early execution of the read command.

When the read command from one of the computers A and B is received at one of the interface circuits 61 and 62, the read-out signal, which is output by the head 13 when reading data from the disk 11, is received at the HDC 65. The HDC 65 produces the read-out data from the received read-out signal, and sends the read-out data to the buffer controller 64. The buffer controller 64 temporarily stores the read-out data, which is received from the HDC 65, into the data buffer memory 63. The buffer controller 64 transfers the read-out data, read from the data buffer memory 63, to one of the computers A and B via one of the interface circuits 61 and 62.

When it is expected that a subsequent read command related to the same sector of the disk 11 is issued, the read-out data of the buffer memory 63 is retained until the execution of the subsequent read command starts. The buffer controller 64 transfers the retained read-out data from the buffer memory 63 to the command source (one of the computers A and B) without reading the data from the disk 11 again. This procedure is called the cache processing, and the buffer memory 63 in this case is called the cache memory. According to the cache processing, the conventional interface device 60 can considerably reduce the total time needed to execute the read commands related to the same sector of the disk 11.

In the conventional interface device 60, when the cache processing is performed, a cache table that provides the correlations between the locations of data stored on the buffer memory 63 and the locations of data stored on the hard disk 11 is used. By accessing the cache table, the buffer controller 64 determines the location of the stored data on the hard disk 11 which corresponds to the location of the stored data on the buffer memory 63.

FIG. 6 shows a control process of command enqueuing performed by the conventional interface device.

As shown in FIG. 6, at a start of the control process, the buffer controller 63 determines whether the command is received (S1-1). When the result at the step S1-1 is affirmative, the buffer controller 63 determines whether the received command is valid (S1-2). Otherwise the control of the buffer controller 63 is transferred to a different process.

When the result at the step S1-2 is affirmative, the buffer controller 63 links the received command to the command queue of one of the interface circuits 61 and 62, and the command is retained in one of the interface circuits 61 and 62 (S1-3). Otherwise the buffer controller 63 sends a rejection message to the command source. After the step S1-3 is performed, the control process of FIG. 6 ends.

In the conventional interface device 60, when the write command from one of the computers A and B is received at one of the interface circuits 61 and 62, the writing data from the computer A or the computer B is temporarily stored in the buffer memory 63. After the writing data is stored in the buffer memory 63, the buffer controller 64 informs the command source (the computer A or B) that the execution of the write command is complete. Thereafter, the buffer controller 64 causes the stored data of the buffer memory 63 to be written to the disk 11 by means of the head 13 during an idle time of the head 13. This procedure is called the write-back processing.

When the read command to access the related sector of the disk 11 is issued before the write-back processing is performed, the execution of the read command is deferred and the write-back processing is performed first. Thereafter, the data is read from the hard disk 11.

In the conventional interface device 60, when the write-back processing is performed, a write-back table that provides the correlations between the locations of data stored on the buffer memory 63 and the locations of data stored on the hard disk 11 is used to send a message to the computer A or B. By accessing the write-back table, the buffer controller 64 determines the location of the stored data on the hard disk 11 which corresponds to the location of the stored data on the buffer memory 63.

Both the cache table and the write-back table provide the correlations between the data locations of the buffer memory 23 and the data locations of the hard disk 11. Operational state flags and data validity flags may be added to the cache table and the write-back table, and a common table that is derived from the cache table and the write-back table including the flags may be used.

As described above, because of the data transfer capacity of the buffer memory 63, it is difficult that the conventional interface device 60 in FIG. 5 efficiently carry out the data reading/writing operations in the hard disk drive with the buffer memory 63.

SUMMARY OF THE INVENTION

An object of the present invention is to provide an improved hard disk controller of a hard disk drive in which the above-described problems are eliminated.

Another object of the present invention is to provide a data processing device that enables the high-level function firmware and the low-level function firmware to be incorporated into a ROM of a hard disk drive, in order to lower the manufacturing cost.

Another object of the present invention is to provide a signal processing device that can reduce the number of test select terminals needed for testing an LSI of a hard disk drive.

Another object of the present invention is to provide an interface device that efficiently carries out the data input/output operations in a hard disk drive without being affected by the data transfer capacity of the buffer memory.

The above-mentioned objects of the present invention are achieved by a data processing device in which data processing device in which a processor processes data based on a stored program and a buffer manager accesses the data, the data processing device comprising: a program memory which stores program codes, the program codes being loaded into the program memory and executed by the processor when processing the data; a shared memory which stores one of the program codes and the data; and a control unit which selectively connects one of the processor and the buffer manager to the shared memory based on a select pattern, wherein the shared memory functions to store the program codes when the select pattern is set in a first condition, and the shared memory functions to store the data when the select pattern is set in a second condition.

The above-mentioned objects of the present invention are achieved by an signal processing device in which an internal logic circuit performs a logic operation for input signals, received from input terminals, and outputs processed signals to output terminals, the signal processing device comprising: a register which stores a pattern of addresses provided for selection of a signal being tested; a selecting unit which receives respective testing signals of the internal logic circuit, and selects a number of testing signals from among the received testing signals based on the pattern of addresses stored in the register; and an output unit which sequentially selects one of the testing signals selected by the selecting unit, and outputs each selected testing signal to a test output terminal.

The above-mentioned objects of the present invention are achieved by an interface device which performs data input/output operations through a plurality of channels, the interface device comprising: a plurality of buffer memories which includes a first memory buffer and a second memory buffer, each buffer memory provided for a particular one of the plurality of channels; and a control unit which controls the data input/output operations for each of the plurality of buffer memories such that data stored in the first buffer memory and data stored in the second buffer memory are set to be identical to each other by performing data transfer between the first buffer memory and the second buffer memory.

The data processing device of the preferred embodiment of the invention enables the low-level function firmware and the high-level function firmware to be incorporated into a ROM of a hard disk drive. The data processing device of the preferred embodiment is effective in providing the hard disk controller with low cost, and it is possible to realize reduction of the manufacturing cost of the hard disk drive with the data processing apparatus of the present embodiment.

In the signal processing device of the preferred embodiment of the invention, the selecting unit selects a number of testing signals from among the received testing signals based on the pattern of addresses stored in the register. The output unit sequentially selects one of the testing signals selected by the selecting unit, and outputs each selected testing signal to the test output terminal. The signal processing device of the preferred embodiment does not require the test select terminals as in the conventional signal processing device. The signal processing device of the preferred embodiment is effective in reducing the number of test select terminals needed for testing an integrated circuit of a hard disk drive.

In the interface device of the preferred embodiment of the invention, the control unit controls the data input/output operations for each of the plurality of buffer memories corresponding to each of a first interface (IF A) and a second interface (IF B) such that data of the first interface (IF A) stored in the first buffer memory and data of the second interface (IF B) stored in the second buffer memory are set to be identical to each other by performing data transfer between the first buffer memory and the second buffer memory. The interface device of the preferred embodiment is effective in increasing the efficiency of the data input/output operations in a hard disk drive without being affected by the data transfer capacity of the buffer memory for the other interface data transmission as in the conventional single-buffered interface device.

BRIEF DESCRIPTION OF THE DRAWINGS

Other objects, features and advantages of the present invention will become apparent from the following detailed description when read in conjunction with the accompanying drawings.

FIG. 12 is a diagram for explaining a data management table used by the interface device of the present embodiment.

DETAILED DESCRIPTION OF PREFERRED EMBODIMENTS

A description will now be given of preferred embodiments of the present invention with reference to the accompanying drawings.

Figure 7:
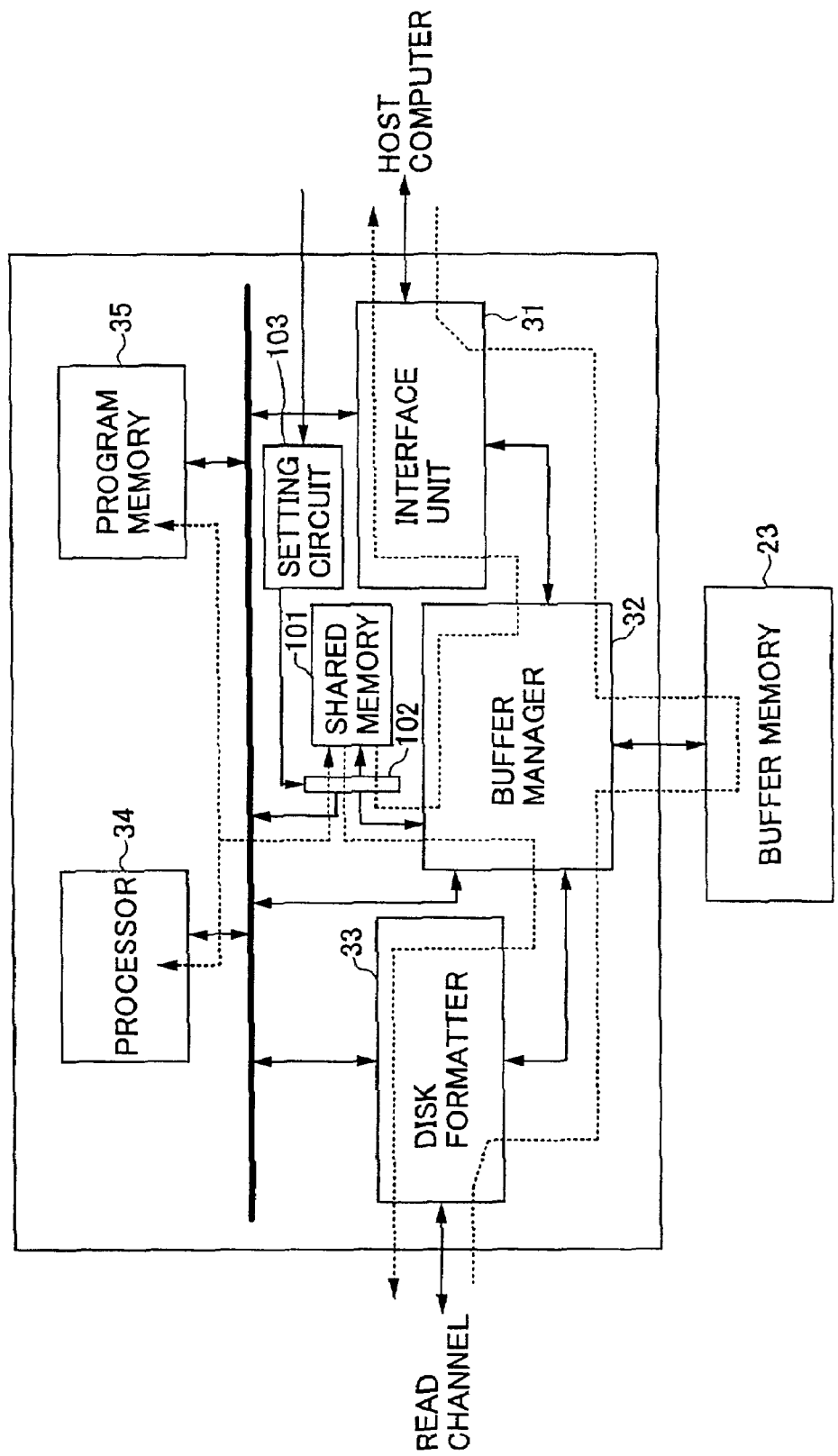
FIG. 7 is a block diagram of a preferred embodiment of the hard disk controller of the invention.

FIG. 7 shows a preferred embodiment of the hard disk controller of the invention. The hard disk controller 100 of the present embodiment is applied to the hard disk drive in FIG. 1. In FIG. 7, the elements that are essentially the same as corresponding elements in FIG. 2 are designated by the same reference numerals, and a description thereof will be omitted.

As shown in FIG. 7, the hard disk controller 100 generally includes an interface unit 31, a buffer manager 32, a disk formatter 33, a processor 34, a program memory 35, a shared memory 101, a multiplexer 102, and a setting circuit 103.

These elements of the hard disk controller 100 are interconnected by a bus as indicated in FIG. 7.

In the hard disk controller 100, when a firmware with low-level functions is installed, the amount of storage of the program memory 35 is set at an optimum amount of storage for storing the program codes of the low-level function firmware. Hence, when a firmware with high-level functions is installed in addition to the low-level function firmware, the optimum amount of storage of the program memory 35 is likely to be insufficient to store the program codes of the high-level function firmware.

Generally, the high-level function firmware contains a large amount of program codes, and the low-level function firmware contains a small amount of program codes. Hence, the amount of storage needed to store the high-level function firmware is much larger than the amount of storage needed to store the low-level function firmware.

In the present embodiment, when the firmware with high-level functions is installed additionally, the portion of the high-level function firmware that exceeds the storage capacity (the optimum amount) of the program memory 35 and is not stored in the program memory 35 is stored into the shared memory 101. In this case, the shared memory 101 is used as a secondary program memory.

When only the low-level function firmware is stored on the ROM 25, the low-level function firmware from the ROM 25 is loaded into the program memory 35. In this case, the shared memory 101 is not used to store the low-level function firmware. The shared memory 101 is used as the buffer memory instead of the externally attached buffer memory 23, and the externally attached buffer memory 23 may be omitted.

The determination as to whether the shared memory 101 is used as the program memory or the buffer memory is made based on the select pattern sent from the multiplexer 102 and the setting circuit 103. By changing the select pattern, the operating condition of the shared memory 101 is switched from one of the program memory condition and the buffer memory condition to the other.

Figure 8:
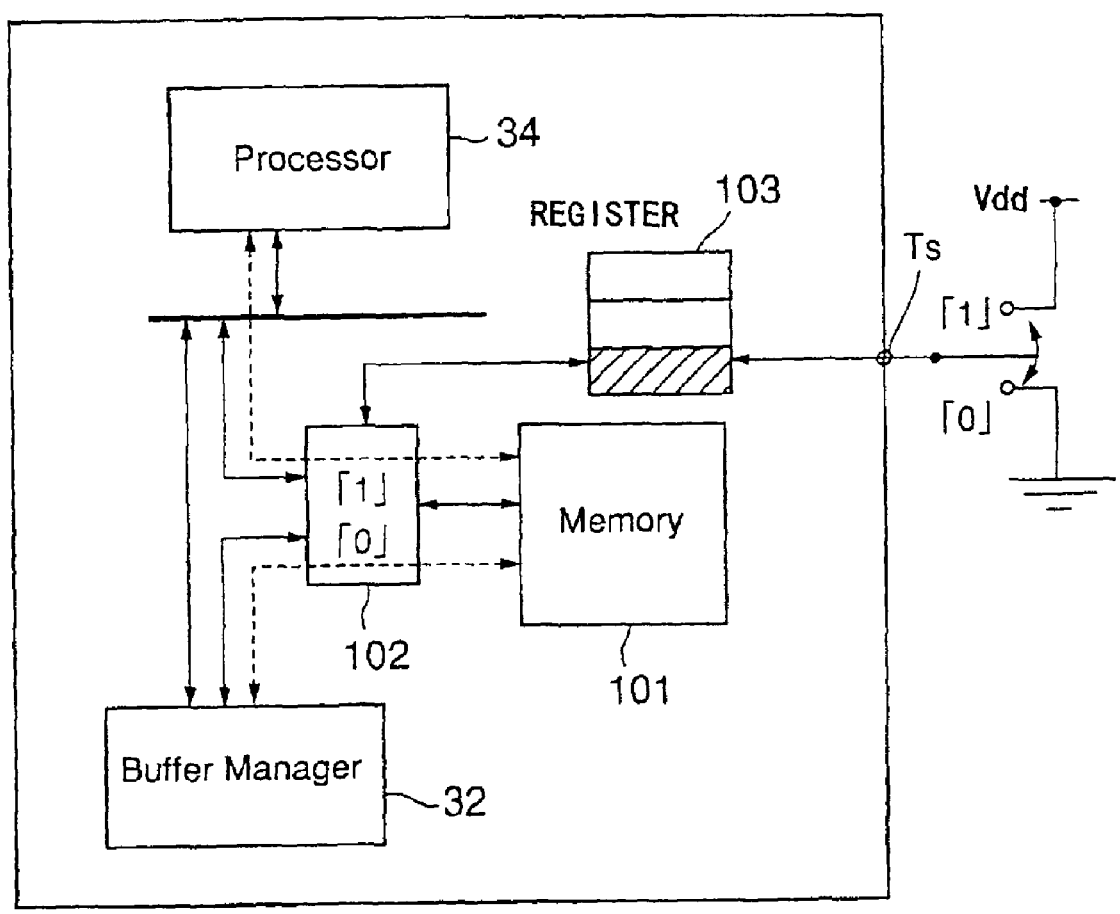
FIG. 8 is a diagram for explaining a shared memory switching operation performed by the hard disk controller of the present embodiment.

FIG. 8 shows a shared memory switching operation performed by the hard disk controller of the present embodiment.

As shown in FIG. 8, the setting circuit 103 comprises a select pattern register, and this select pattern register is connected to a select terminal "Ts". The select pattern register is set to "1" or "0" based on the voltage of the select terminal "Ts". For example, when the voltage of the select terminal "Ts" is set to "Vdd", the select pattern register of the setting circuit 103 is set to "1". When the select terminal "Ts" is grounded (or set to zero volt), the select pattern register of the setting circuit 103 is set to "0".

When the setting circuit 103 is set to "1", the multiplexer 102 connects the processor 34 to the shared memory 101 via a first connecting line indicated by the upper dotted line in FIG. 8. This allows the processor 34 to access the shared memory 101 through the multiplexer 102. When the setting circuit 103 is set to "0", the multiplexer 102 connects the buffer manager 32 to the shared memory 101 via a second connecting line indicated by the lower dotted line in FIG. 8. This allows the buffer manager 32 to access the shared memory 101 through the multiplexer 102.

In the above-described embodiment, when it is desired that the hard disk controller 100 operates based on the high-level function firmware, the voltage of the select terminal "Ts" is set to "Vdd", and the setting circuit 103 is set to "1". In this case, when the hard disk controller 100 is powered on, the program codes of the high-level function firmware are loaded from the ROM 25 into the program memory 35 and the shared memory 101, and they are stored in the program memory 35 and the shared memory 101 in a distributed manner. Namely, the portion of the high-level function firmware that exceeds the storage capacity of the program memory 35 and is not stored in the program memory 35 is stored into the shared memory 101. Then, it is possible that the hard disk controller 100 operate based on the high-level function firmware. In this case, the buffer memory 23 is externally attached to the hard disk controller 100, and it temporarily stores the writing data or the read-out data.

Further, in the above-described embodiment, when it is desired that the hard disk controller 100 operates based on the low-level function firmware, the voltage of the select terminal "Ts" is set to zero volt, and the setting circuit 103 is set to "0". In this case, when the hard disk controller 100 is powered on, the program codes of the low-level function firmware are loaded from the ROM 25 into the program memory 35 only, and they are stored in the program memory 35. Then, it is possible that the hard disk controller 100 operate based on the low-level function firmware. In this case, the buffer manager 32 is able to access the shared memory 101, and the shared memory 101 is used as the data buffer memory. The hard disk controller 100 of the present embodiment does not require the externally attached buffer memory 23. Hence, the hard disk controller 100 of the present embodiment is effective in providing high-speed data transfer and low power consumption with low cost.

The hard disk controller 100 of the present embodiment is provided with the shared memory 101, the multiplexer 102 and the setting circuit 103, and it can incorporate the low-level function firmware and the high-level function firmware into the ROM 25. It is possible to provide the hard disk controller with low cost, and it is possible to realize reduction of the manufacturing cost of the hard disk drive with the hard disk controller 100 of the present embodiment.

Figure 9:
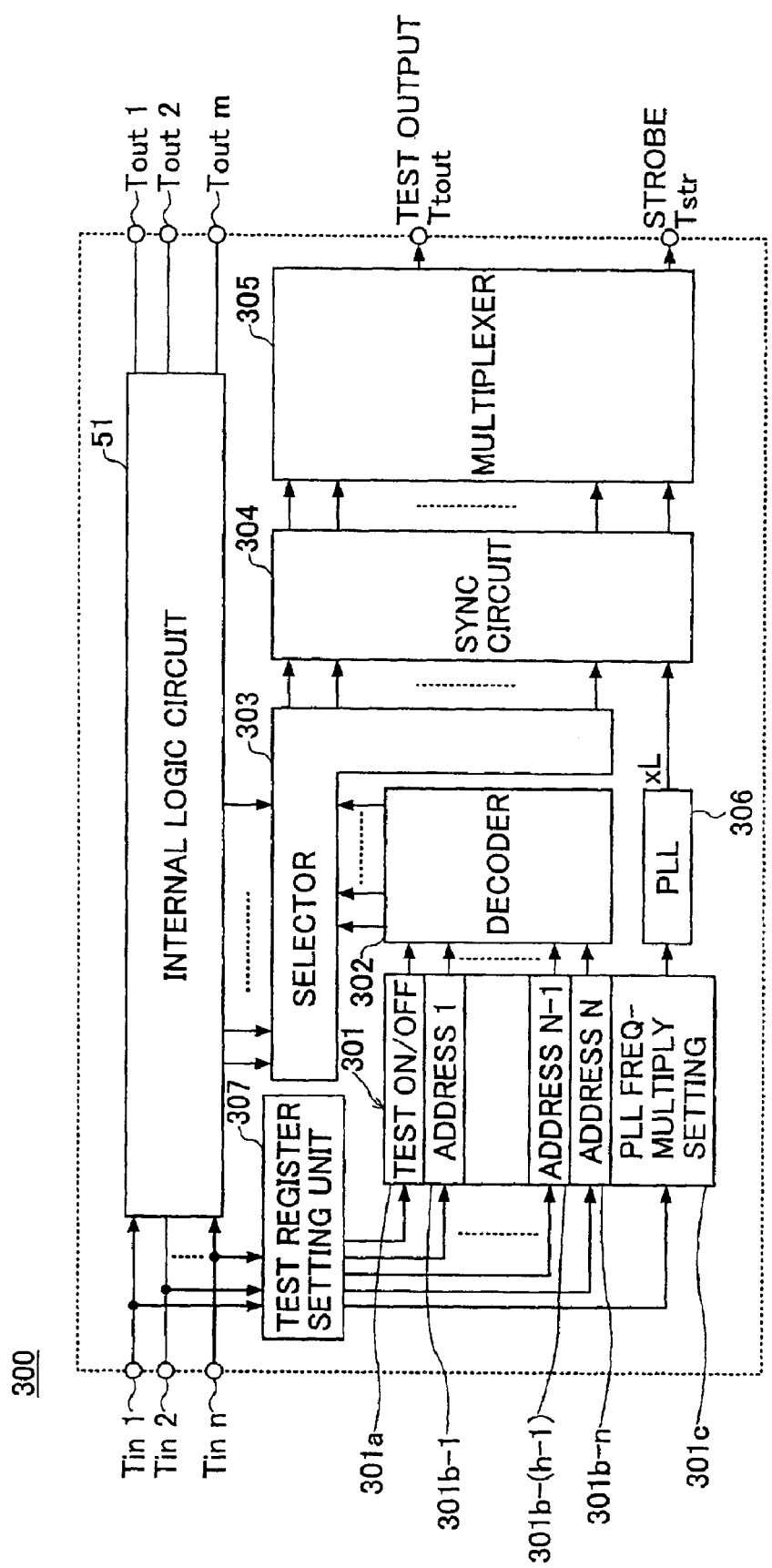
FIG. 9 is a block diagram of a preferred embodiment of the signal processing device of the invention.

Next, FIG. 9 shows a preferred embodiment of the signal processing device of the invention.

Figure 1:
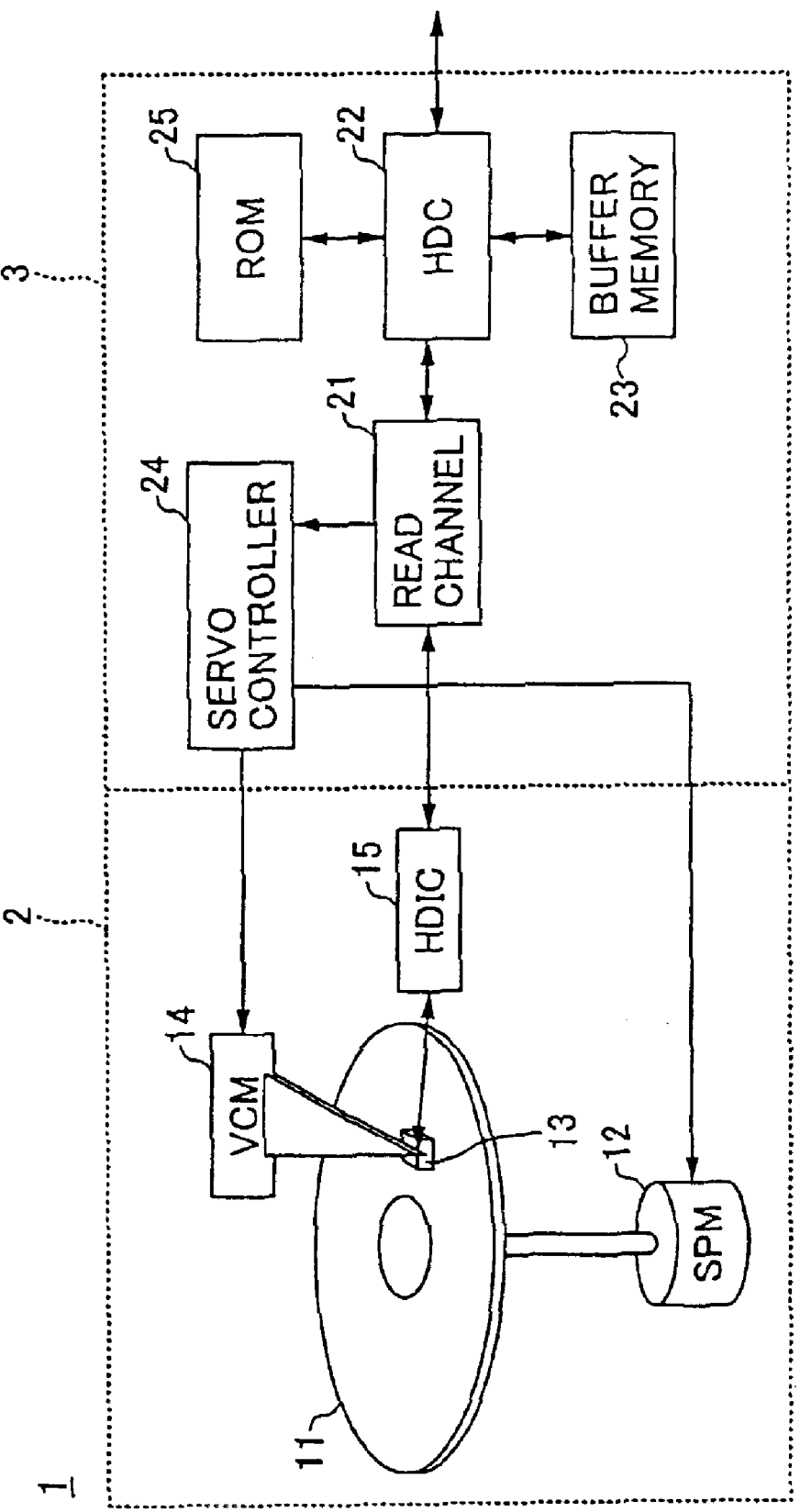
FIG. 1 is a block diagram of a hard disk drive.
Figure 2:
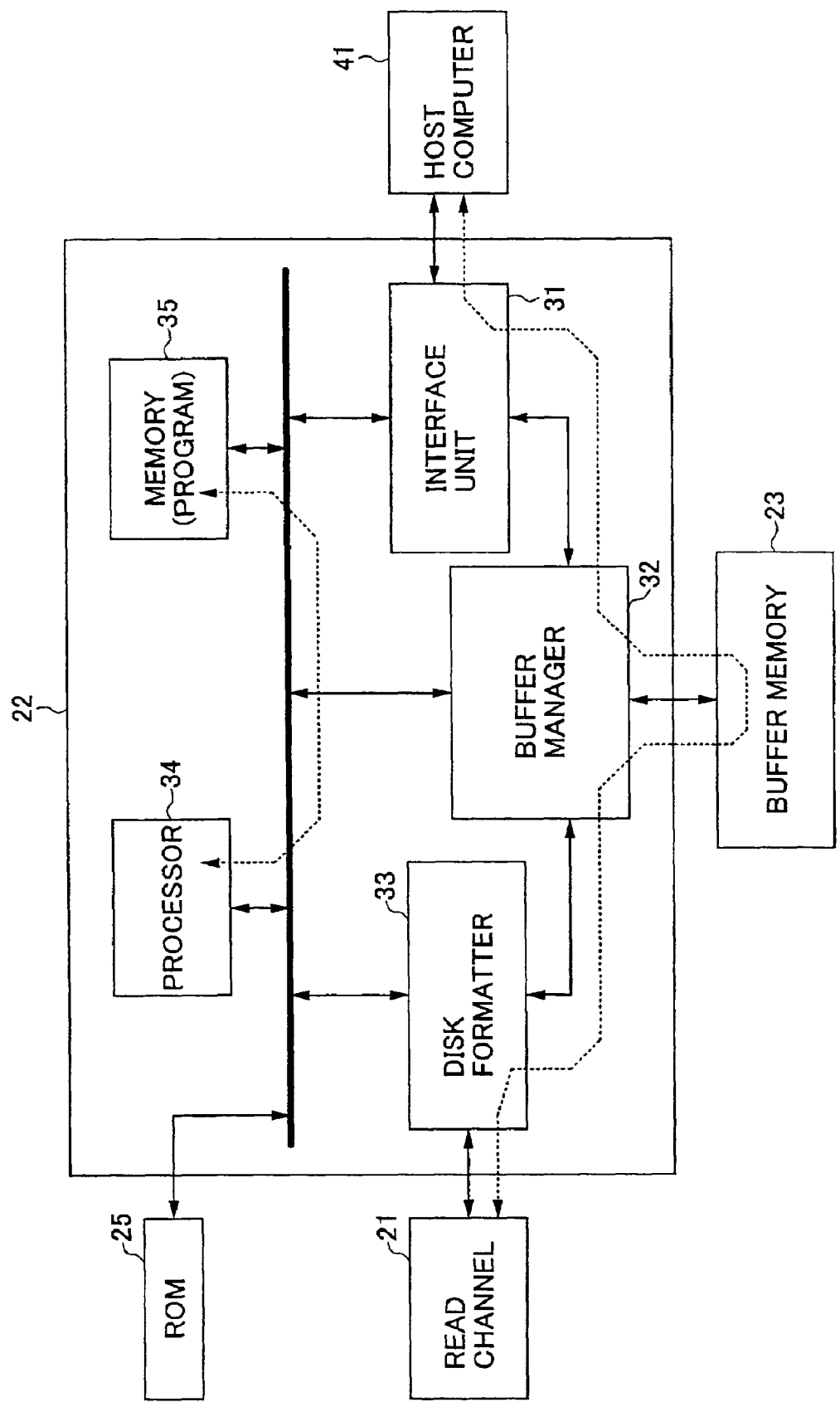
FIG. 2 is a block diagram of a conventional hard disk controller in the hard disk drive.

The signal processing device of the present embodiment is applied to the hard disk drive in FIG. 1. In FIG. 9, the elements that are essentially the same as corresponding elements in FIG. 3 are designated by the same reference numerals, and a description thereof will be omitted.

As shown in FIG. 9, the signal processing device 300 of the present embodiment generally includes an internal logic circuit 51, a test register 301, a decoder 302, a selector 303, a sync circuit 304, a multiplexer 305, a PLL (phase-locked loop) circuit 306, and a test register setting unit 307. The signal processing device 300 includes the input terminals "Tin 1" through "Tin n" and the output terminals "Tout 1"–"Tout m" connected to the internal logic circuit 51, but it does not require the test select terminals "Ts1" through "Tsp" as in the conventional signal processing device shown in FIG. 3.

Figure 3:
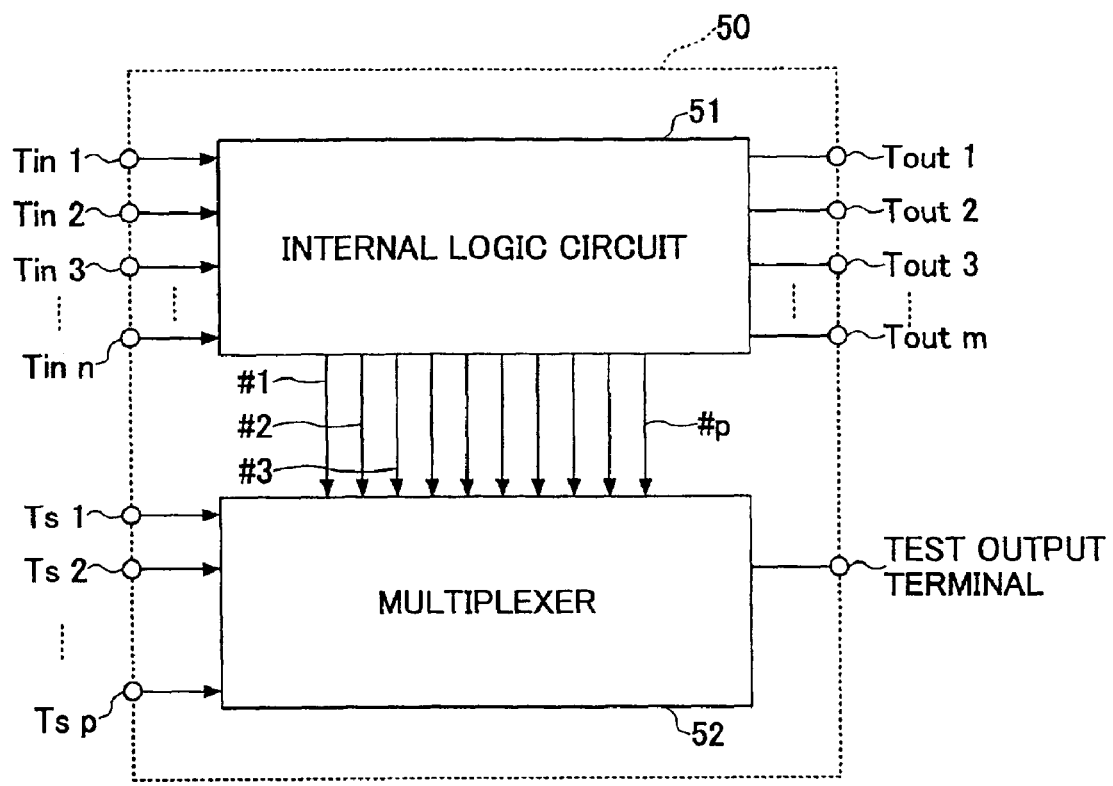
FIG. 3 is a block diagram of a conventional LSI.
Figure 4:
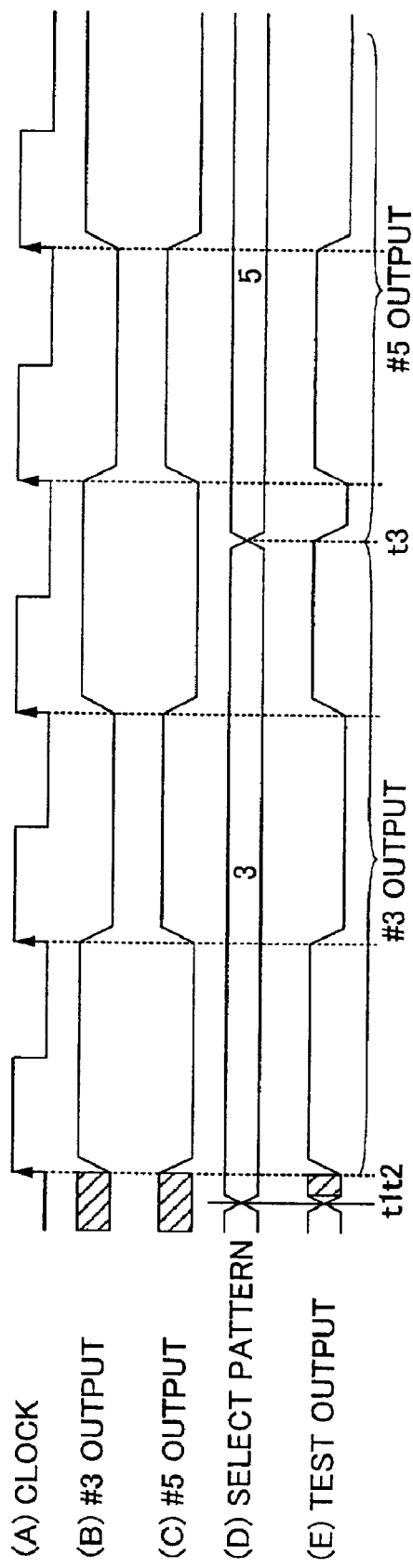
FIG. 4 is a time chart for explaining operation of the conventional LSI during a test.

In the signal processing device 300, the internal logic circuit 51 is essentially the same as the internal logic circuit 51 shown in FIG. 3. The test register 301 includes a test on/off area 301a, a number of address areas 301b-1 through 301b-n, and a PLL frequency multiply setting area 301c. In the test register 301, the test on/off area 301a stores a test on/off parameter sent by the test register setting unit 307. The address areas 301b-1 through 301b-n store respective addresses that are sent by the test register setting unit 307 for selection of a signal being tested. The PLL frequency multiply setting area 301c stores a PLL frequency multiply factor sent by the test register setting unit 307. The test on/off parameter from the test on/off area 301a and the respective addresses from the address areas 301b-1 through 301b-n are sent to the decoder 302. The PLL frequency-multiply factor from the setting area 301c is sent to the PLL circuit 306.

In the signal processing device 300, the decoder 302 receives the test on/off parameter and the respective addresses from the test register 301. The decoder 302 is set in an active state when the received test on/off parameter is set in test-on state. When the decoder 302 is active, the decoder 302 generates a select signal based on the respective addresses received from the test register 301, and transfers the select signal to the selector 303.

In the signal processing device 300, the selector 303 receives the respective testing signals from the blocks of the internal logic circuit 51. The selector 303 selects a number of the testing signals from among the received testing signals based on the select signal sent by the decoder 302, and sends the selected testing signals to the sync circuit 304. The sync circuit 304 synchronizes the selected testing signals from the selector 303 with the clock signal from the PLL circuit 306. The PLL circuit 306 generates a clock signal from a reference clock signal of the internal logic circuit 51 based on the PLL frequency multiply factor (N) of the PLL frequency-multiply setting area 301c of the test register 301. The PLL circuit 306 sends the clock signal to the sync circuit 304.

In the signal processing device 300, the selected testing signals, which are synchronized with the clock signal, are sent from the sync circuit 304 to the multiplexer 305. Further, the clock signal from the PLL circuit 306 is sent to the multiplexer 305 via the sync circuit 304. The multiplexer 305 sequentially selects one of the testing signals from the sync circuit 304, based on the clock signal from the sync circuit 304, and outputs each selected testing signal to the test output terminal "Ttout" of the signal processing device 300. Further, the multiplexer 305 outputs the clock signal, received from the sync circuit 304, to a strobe terminal "Tstr" of the signal processing device 300.

The signal processing device 100 of the present embodiment can detect a particular one of the blocks of the internal logic circuit 51 that corresponds to the selected testing signal of the test output terminal "Ttout", based on the clock signal of the strobe terminal "Tstr".

Figure 10:
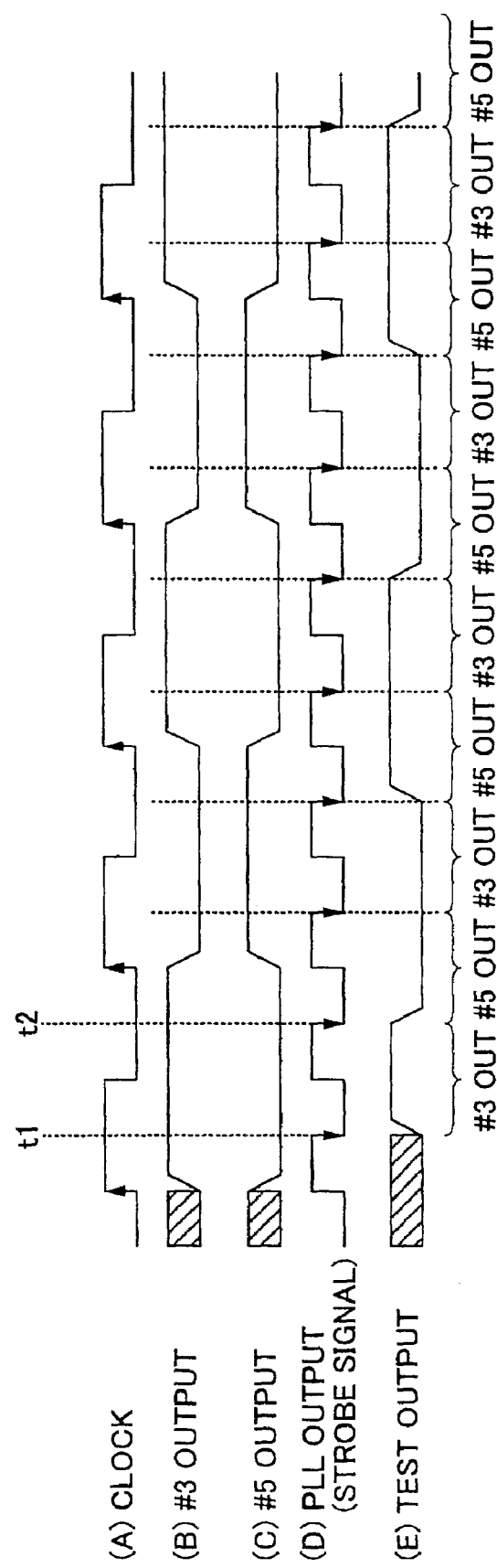
FIG. 10 is a time chart for explaining operation of the signal processing device of the present embodiment during a test.

FIG. 10 is a time chart for explaining operation of the signal processing device of the present embodiment during a test. In FIG. 10, (A) indicates the reference clock signal of the signal processing device 100, (B) indicates an output signal of the block #3, (C) indicates an output signal of the block #5, (D) indicates the clock signal output by the PLL circuit 306, and (E) indicates an output signal of the test output terminal "Ttout".

As described earlier, the multiplexer 305 sequentially selects one of the "n" testing signals, which are selected according to the select signal derived from the respective addresses of the test register 301, based on the reference clock signal indicated in FIG. 10(A), and outputs the selected testing signals to the test output terminal "Ttout" within one period of the reference clock signal.

As indicated in FIG. 10(D), at time "t1", which matches with the time of a falling edge of the clock signal of the PLL circuit 306, the multiplexer 305 selects the block #3 signal indicated in FIG. 10(B), and the multiplexer 305 outputs the block #3 signal to the test output terminal "Ttout" as indicated in FIG. 10(E).

Further, at time "t2", which matches with the time of a next falling edge of the clock signal of the PLL circuit 306, the multiplexer 305 selects the block #5 signal indicated in FIG. 10(C), and the multiplexer 305 outputs the block #5 signal to the test output terminal "Ttout" as indicated in FIG. 10(E).

In the present embodiment, the clock signal of the PLL circuit 306 indicated in FIG. 10(D) has a frequency that is N (the frequency multiply factor of the area 301c of the test register 301) times as large as the frequency of the reference clock signal indicated in FIG. 10(A). In the example of FIG. 10, the clock signal of the PLL circuit 306 has a frequency that is twice as large as the frequency of the reference clock signal. By using the clock signal of the strobe terminal "Tstr" (which is the same as the clock signal of the PLL circuit 306), it is possible that the signal processing device 100 of the present embodiment detect a particular one of the blocks of the internal logic circuit 51 that corresponds to the selected testing signal of the test output terminal "Ttout".

Figure 11:
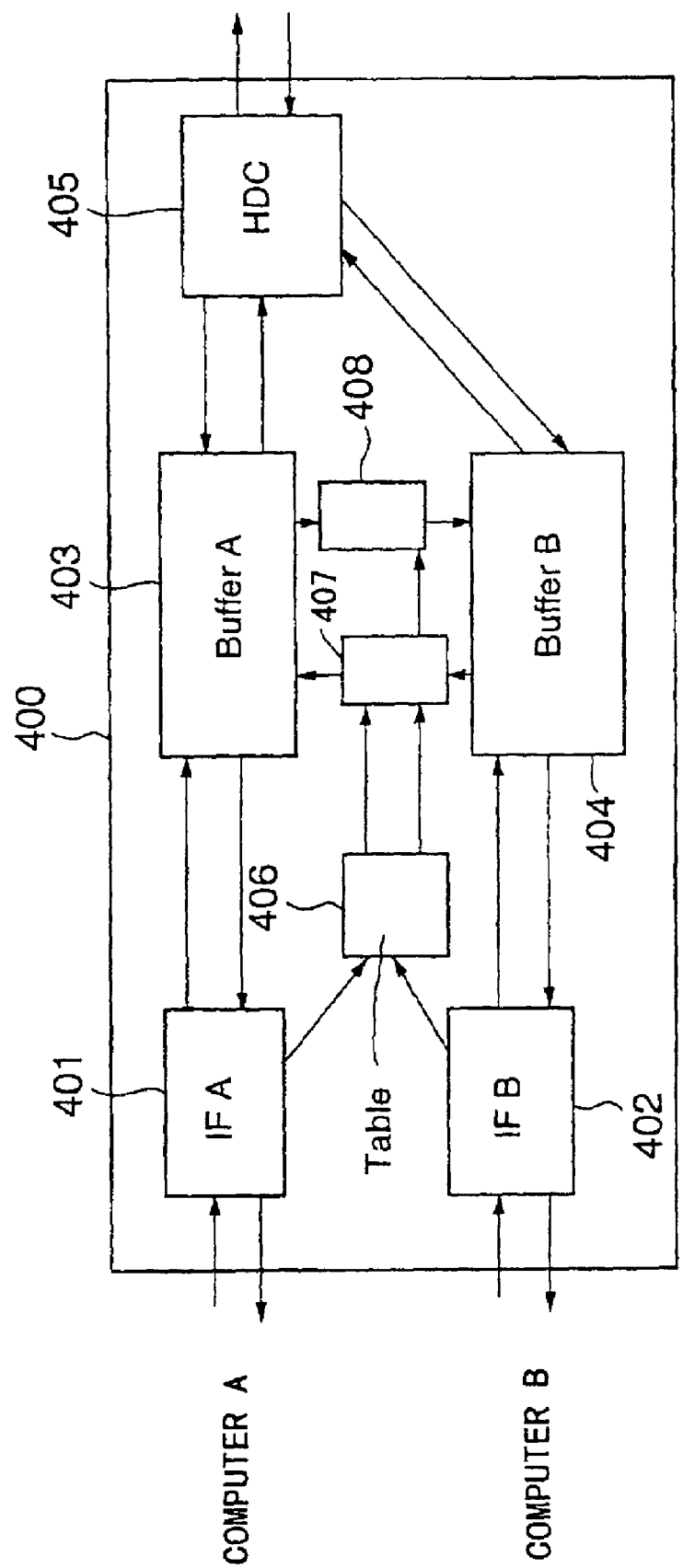
FIG. 11 is a block diagram of a preferred embodiment of the interface device of the invention.

Next, FIG. 11 shows a preferred embodiment of the interface device of the invention.

Figure 5:
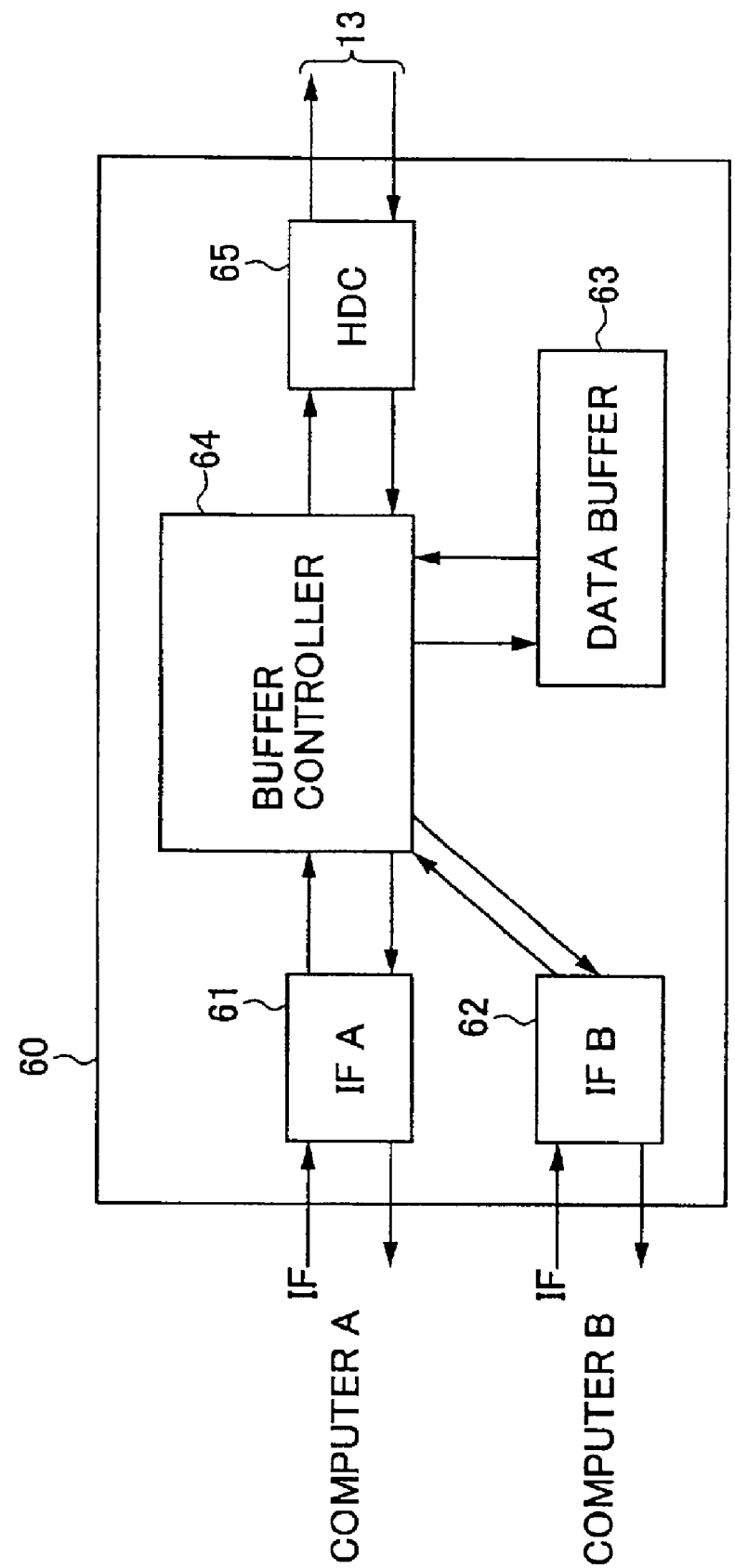
FIG. 5 is a block diagram of a conventional interface device.
Figure 6:
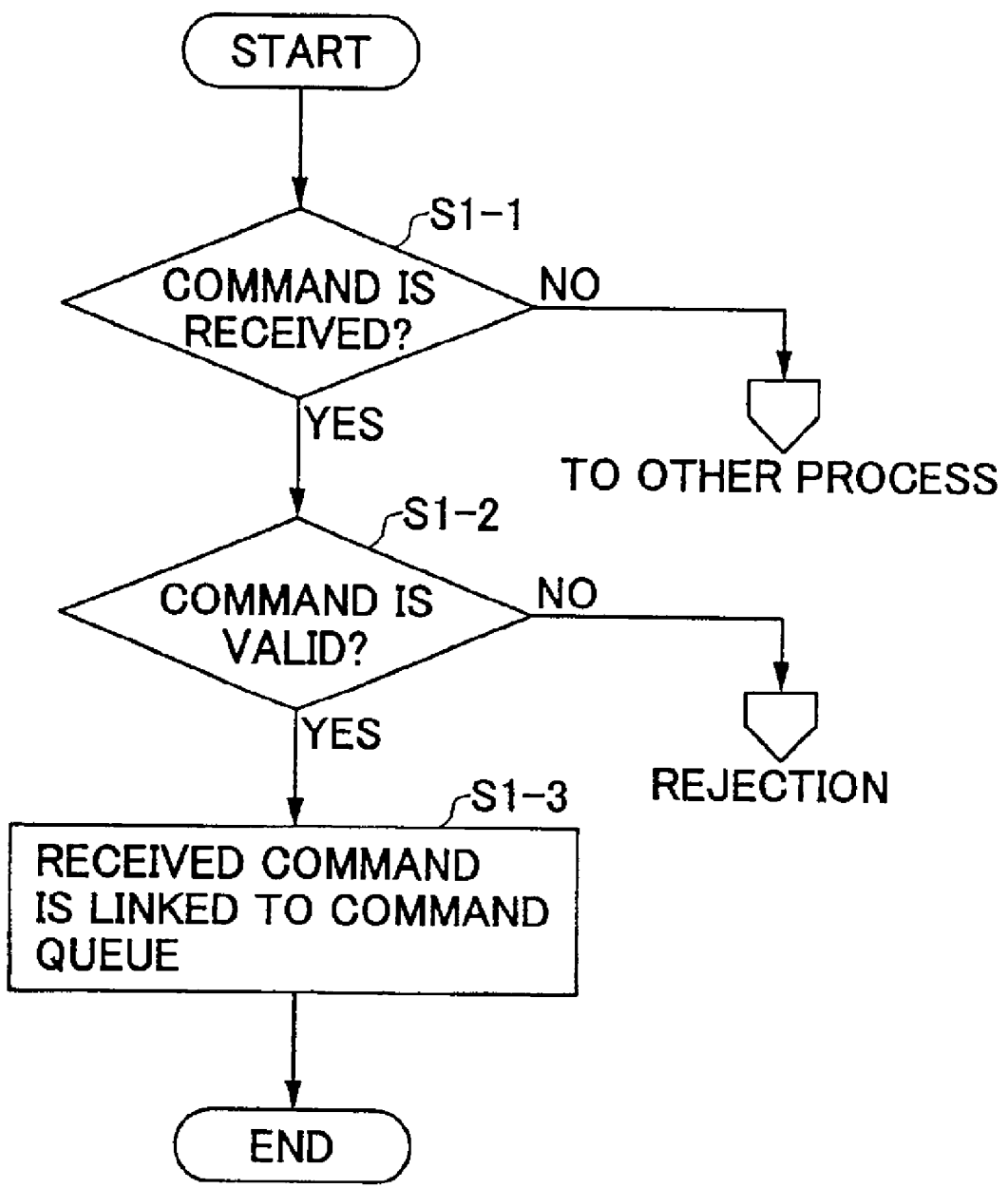
FIG. 6 is a flowchart for explaining a control process of command enqueuing performed by the conventional interface device.

The interface device of the present embodiment is applied to the hard disk drive in FIG. 1. In FIG. 11, the elements that are essentially the same as corresponding elements in FIG. 5 are designated by the same reference numerals, and a description thereof will be omitted.

As shown in FIG. 11, the interface device 400 of the present embodiment generally includes an interface circuit (IF A) 401, an interface circuit (IF B) 402, a buffer memory (BUFFER A) 403, a buffer memory (BUFFER B) 404, a data management table 406, a first-in first-out data buffer (FIFO) 407, a first-in first-out data buffer (FIFO) 408, and a hard disk controller (HDC) 405.

In the interface device 400, the interface circuit 401, the buffer memory 403 and the HDC 405 form a channel-A data path, while the interface circuit 402, the buffer memory 404 and the HDC 405 form a channel-B data path. In the present embodiment, the interface device 400 includes only two channels, for the sake of simplicity of description. Alternatively, the interface device 400 may include three or more channels.

Suppose that the input/output data transfer in the channel-A data path and the input/output data transfer in the channel-B data path in the interface device 400 of the present embodiment are controlled independently of each other, for the sake of simplicity of description. Further, suppose that the input/output data transfer of each channel is performed on the basis of a sector of the disk 11, for the sake of simplicity of description.

In the interface device 400, the interface circuit 401 provides the interface between the hard disk drive and a computer A, and the interface circuit 402 provides the interface between the hard disk drive and a computer B. The buffer memory 403 stores the input/output data of the computer A, and the buffer memory 404 stores the input/output data of the computer B.

FIG. 12 shows a data management table used by the interface device 400 of the present embodiment.

As shown in FIG. 12, the data management table 406, which is stored in the interface device 400, provides the correlations between the locations of data stored in the buffer memories 403 and 404 and the locations of data stored in the hard disk 11. For each of the physical addresses on the disk 11 (each respective sector), the corresponding address of the buffer memory 403 related to the computer A and the corresponding address of the buffer memory 404 related to the computer B are recorded. Further, in the data management table 406, update flags of the channels A and B and access-disable flags of the channels A and B are provided for each of the buffer addresses on the BUFFER A 403 and BUFFER B 404. Each of the respective flags is set to "1" or "0".

In the data management table 406 in FIG. 12, the update flags include write-back flags (WR-BK FLAG) of the channels A and B and staging flags (STG FLAG) of the channels A and B. Each of the write-back flags of the channels A and B indicates whether the write-back is performed for the relevant sector of the disk 11. When the write-back flag is set to "1", it indicates that the write-back is pending. Otherwise the write-back flag indicates that the write-back is not pending. Each of the staging flags of the channels A and B indicates whether the staging is performed for the relevant sector of the disk 11. When the staging flag is set to "1", it indicates that the staging is performed. Otherwise the staging flag indicates that the staging is not performed.

In the data management table 406 in FIG. 12, the access-disable flags include copy-state flags (CPY-ST FLAG) of the channels A and B and active-state flags (ACT-ST FLAG) of the channels A and B. Each of the copy-state flags of the channels A and B indicates whether the copying of data from the computer B to the computer A or vice versa with respect to the relevant sector of the disk 11 is in process. For example, when the copy-state flag of the channel A is set to "1", it indicates that the copying of data from the computer B to the computer A with respect to the relevant sector of the disk 11 is in process. Each of the active-state flags of the channels A and B indicates whether the reading/writing of data with respect to the relevant sector of the disk 11 is in process. For example, when the active-state flag of the channel A is set to "1", it indicates that the reading or writing of data with respect to the relevant sector of the disk 11 is in process.

Figure 13:
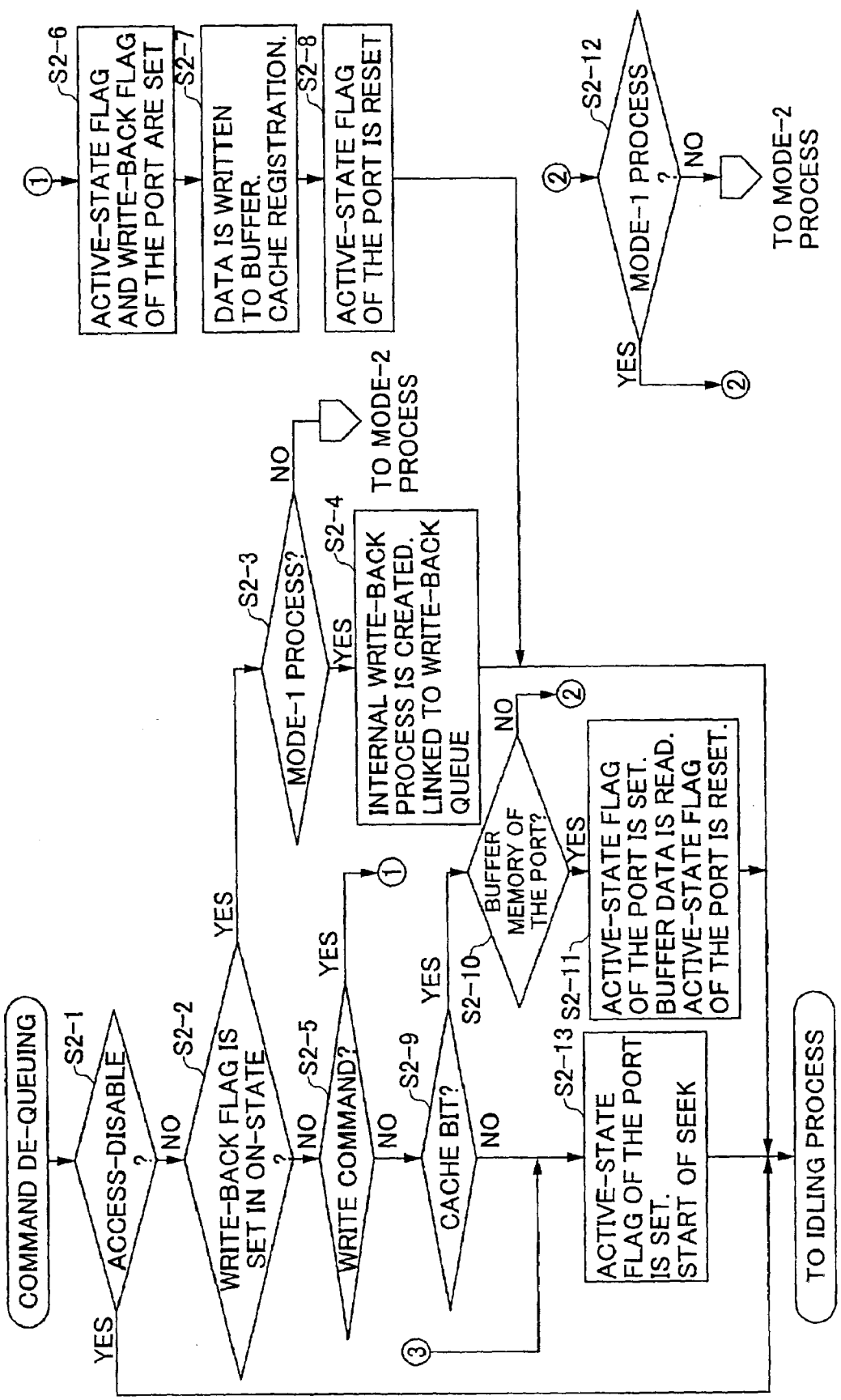
FIG. 13 is a flowchart for explaining a command de-queuing process performed by the interface device of the present embodiment.

FIG. 13 is a flowchart for explaining a command de-queuing process performed by the interface device of the present embodiment.

In the present embodiment, the command de-queuing process in FIG. 13 is called the mode-1 process. During the mode-1 process, the data transfer between the buffer memory 403 and the buffer memory 404 is inhibited. In the mode-1 process, the cache processing of the computer A and the cache processing of the computer B with the hard disk 11 are controlled independently of each other. If the data is stored in the buffer memory (the cache memory) of one of the channels A and B and a read command is issued for the other channel to access the same data of the buffer memory of the former channel during the mode-1 process, a read error (or a cache error) is detected by the interface circuits B and A, and then the interface circuits do the read operation from the disk 11. Namely, in the mode-1 process, the data transfer between the buffer memory 403 and the buffer memory 404 is inhibited.

For the sake of simplicity of description, suppose that a write command is issued for the channel A to transfer the writing data to the hard disk controller 405 within the interface device 400, such that the writing date is recorded to the relevant sector of the disk 11 by the head. When the write command is executed, the interface device 400 carries out the command de-queuing process in FIG. 13.

As shown in FIG. 13, at a start of the process, the interface device 400 retrieves the data management table 406 with respect to the relevant sector of the disk 11. The interface device 400 determines whether the access-disable flags of the channel A for the relevant sector and the access-disable flags of the channel B for the relevant sector are set in ON state (or "1") (S2-1).

When the result at the step S2-1 is negative, the interface device 400 determines whether the write-back flag of the channel A for the relevant sector is set in ON state (or "1") (S2-2). When the result at the step S2-2 is affirmative (the write-back flag ON), the interface device 400 determines whether the current process of the interface device 400 is the mode-1 process (S2-3).

When the result at the step S2-3 is affirmative (the mode-1 process), the interface device 400 creates the internal write-back enqueuing process and keeps the write command on the command queue (S2-4). After the step S2-4 is performed, the control of the interface device 400 is transferred to the idling process. In the idling process, the process for the channel A of the interface device 400 is temporarily set in the idle state.

Figure 14:
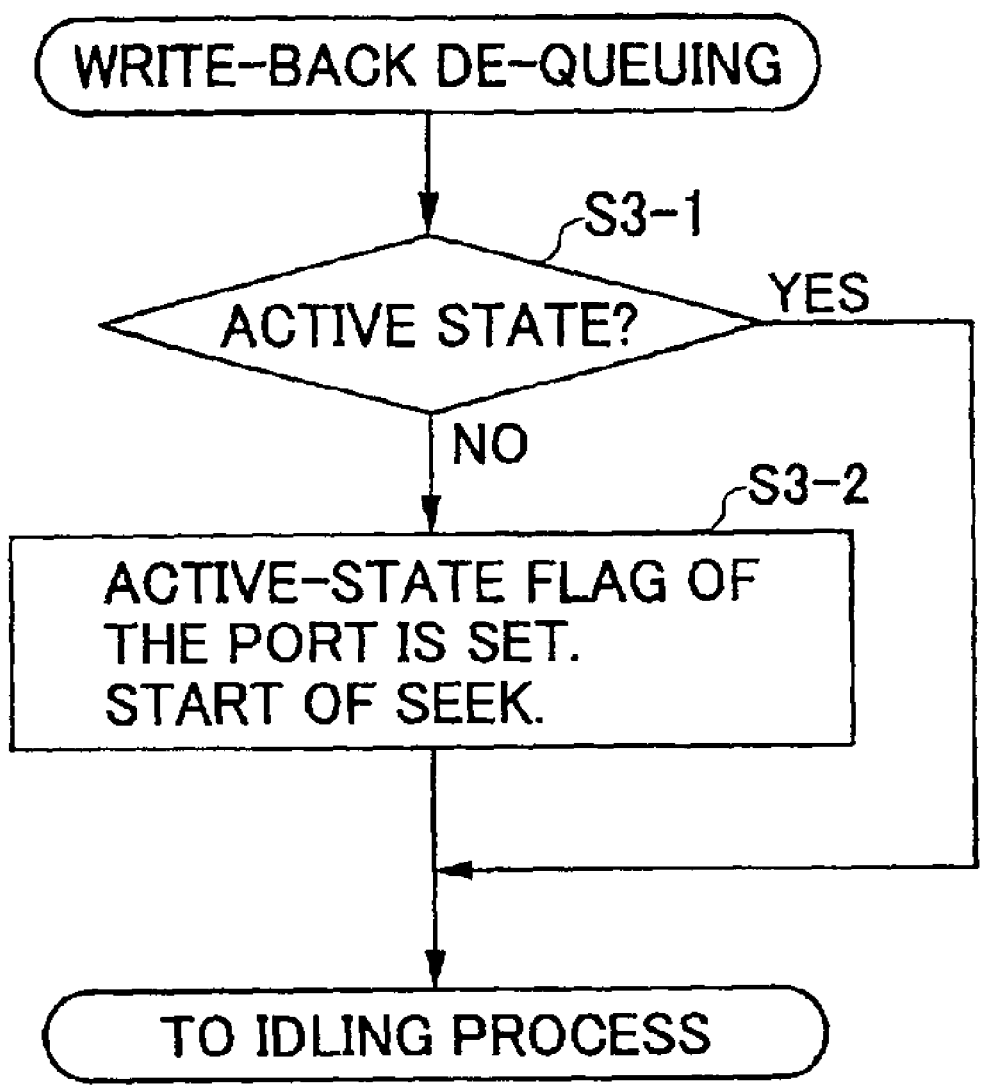
FIG. 14 is a flowchart for explaining a write-back de-queuing process performed by the interface device of the present embodiment.

FIG. 14 shows a write-back de-queuing process performed by the interface device of the present embodiment. After the step S2-4 in the process of FIG. 13 is performed, the interface device 400 starts execution of the write-back de-queuing process of FIG. 14. As described above, the write command is linked to the write-back queue.

As shown in FIG. 14, at a start of the process, the interface device 400 determines whether the active-state flag of the channel B for the relevant sector of the disk 11 is set in ON state (or "1") (S3-1). When the result at the step S3-1 is affirmative (the channel B is in the active state), the process related to the channel A of the interface device 400 is set in the idle state, and the control of the interface device 400 is transferred to the idling process. In this case, the next step S3-2 is not performed and the write-back de-queuing process of FIG. 14 ends.

On the other hand, when the result at the step S3-1 is negative (the channel B is in the inactive state), the interface device 400 sets the active-state flag of the channel A to ON state (or "1"), and starts execution of the seeking operation (S3-2). After the step S3-2 is performed, the write-back de-queuing process of FIG. 14 ends. After the seeking operation is performed, the completion process (which will be described later) will be started.

Figure 15:
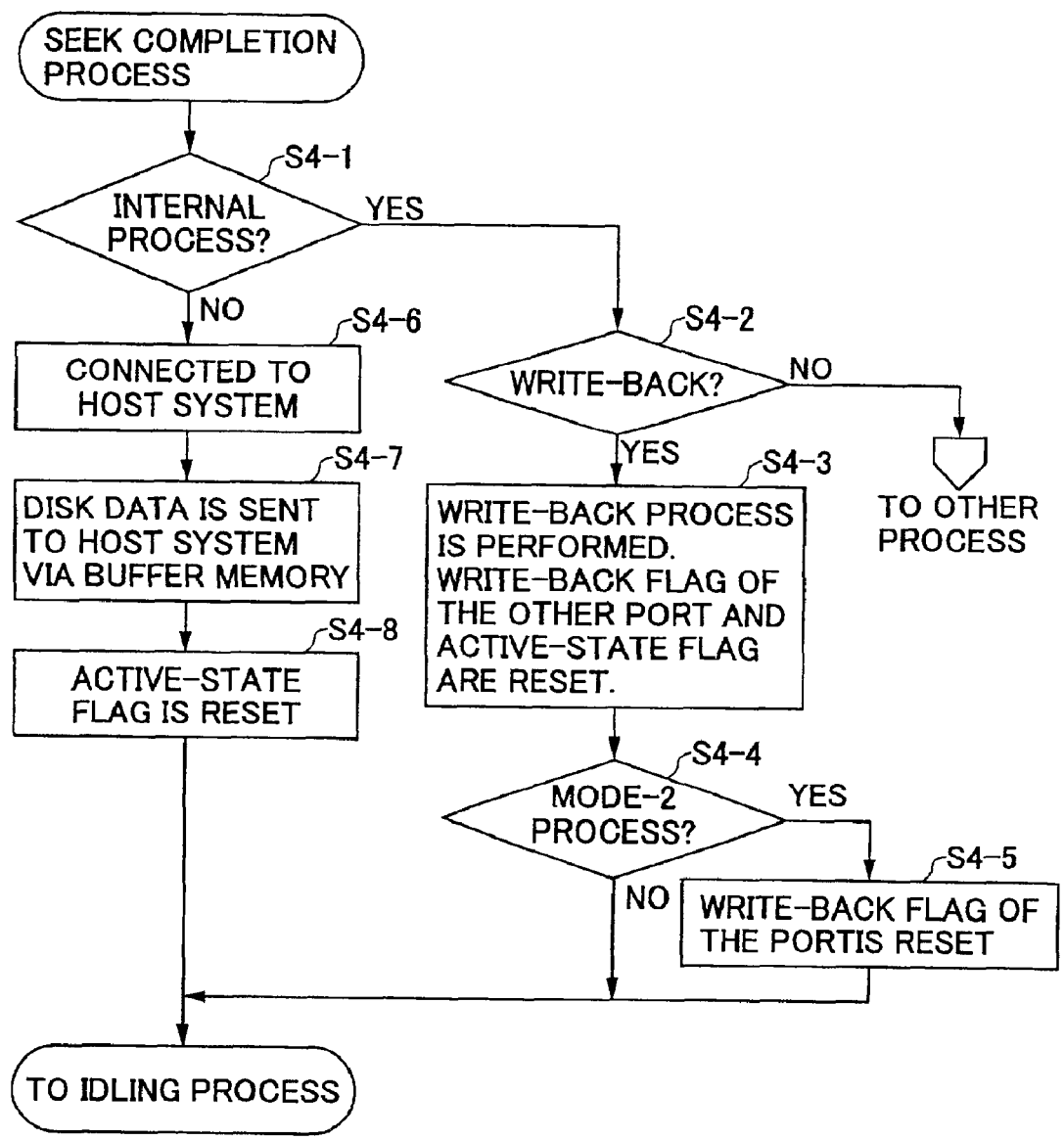
FIG. 15 is a flowchart for explaining a seek completion process performed by the interface device of the present embodiment.

FIG. 15 shows a seek completion process performed by the interface device of the present embodiment. After the step S3-2 in the process of FIG. 14 is performed, the interface device 400 starts execution of the seek completion process of FIG. 15.

As shown in FIG. 15, at a start of the process, the interface device 400 determines whether the current seeking operation of the interface device 400 is the internal process (S4-1). When the result at the step S4-1 is affirmative (the internal process), the interface device 400 determines whether the interface device 400 is requested to perform the write-back process (S4-2).

When the result at the step S4-2 is negative (not the write-back process), the interface device 400 performs another process. When the result at the step S4-2 is affirmative (the write-back process), the interface device 400 causes the HDC 405 to perform the write-back process, resets the write-back flag of the channel B to OFF state (or "0"), and resets the active-state flag of the channel A to OFF state (or "0") (S4-3).

After the step S4-3 is performed, the interface device 400 determines whether the current process of the interface device 400 is the mode-2 process (S4-4). When the result at the step S4-4 is negative (the mode-1 process), the control of the interface device 400 is transferred to the idling process, and the process for the channel A of the interface device 400 is set in the idle state. When the result at the step S4-4 is affirmative (the mode-2 process), the interface device 400 resets the write-back flag of the channel A to OFF state, and sets the process for the channel A in the idle state (S4-5).

On the other hand, when the result at the step S4-1 is negative (not the internal process), the interface device 400 is connected to the computer A (S4-6). Suppose that, in this case, the computer A is the host system that has sent the command for performing the current process to the interface device 400. After the step S4-6 is performed, the interface device 400 sends the disk data, temporarily stored in the buffer memory A, to the computer A via the channel A (S4-7). In the step S4-7, the interface device 400 registers the update and access-disable flags of the current process (requested by the computer A) into the data management table 406 (the cache registration). After the step S4-7 is performed, the interface device 400 resets the active-state flag of the channel A to OFF state (S4-8). After the step S4-8 is performed, the control of the interface device 400 is transferred to the idling process. In the idling process, the process for the channel A of the interface device 400 is set in the idle state.

Referring back to FIG. 13, when the result at the step S2-2 is negative (the write-back flag of the channel A OFF), the interface device 400 determines whether the current command for the channel A is the write command (S2-5).

When the result at the step S2-5 is affirmative (the write command), the interface device 400 sets the write-back flag and the active-state flag of the channel A to ON state ("1") (S2-6). After the step S2-6 is performed, the interface device 400 causes the received data of the channel A to be stored into the buffer memory 403 as the cache memory (S2-7). After the step S2-7 is performed, the interface device 400 resets the active-state flag of the channel A to OFF state (S2-8). After the step S2-8 is performed, the control of the interface device 400 is transferred to the idling process. The process for the channel A of the interface device 400 is set in the idle state.

When the result at the step S2-5 is negative (not the write command), the interface device 400 determines whether a cache hit has occurred (S2-9). Namely, in the step S2-9, it is determined whether the stored data is currently included in the buffer memory 403 (or the buffer memory 404) for the cache processing. When the result at the step S2-9 is affirmative (the occurrence of cache hit), the interface device 400 determines whether the buffer memory where the cache hit has occurred is the buffer memory 403 for the channel A (S2-10). When the result at the step S2-10 is affirmative (the cache hit for the channel A), the interface device 400 sets the active-state flag of the channel A in ON state, causes the stored data of the buffer memory 403 to be transferred to the command source (the cache reading process), and then resets the active-state flag of the channel A to OFF state (S2-11). After the step S2-11 is performed, the control of the interface device 400 is transferred to the idling process. The process for the channel A of the interface device 400 is set in the idle state.

When the result at the step S2-9 is negative (the cache hit has not occurred), the interface device 400 sets the active-state flag of the channel A in ON state, and starts execution of the seeking operation for the head of the hard disk drive (S2-13). After the step S2-13 is performed, the control of the interface device 400 is transferred to the idling process. The process for the channel A of the interface device 400 is set in the idle state.

When the result at the step S2-10 is negative (the cache hit for the channel B), the interface device 400 determines whether the current process of the interface device 400 is the mode-1 process (S2-12). When the result at the step S2-12 is affirmative (the mode-1 process), the interface device 400 performs the above step S2-13. After the step S2-13 is performed, the control of the interface device 400 is transferred to the idling process. The process for the channel A of the interface device 400 is set in the idle state. When the result at the step S2-12 is negative (the mode-2 process), the interface device 400 performs the mode-2 process, which will be described later.

Figure 16:
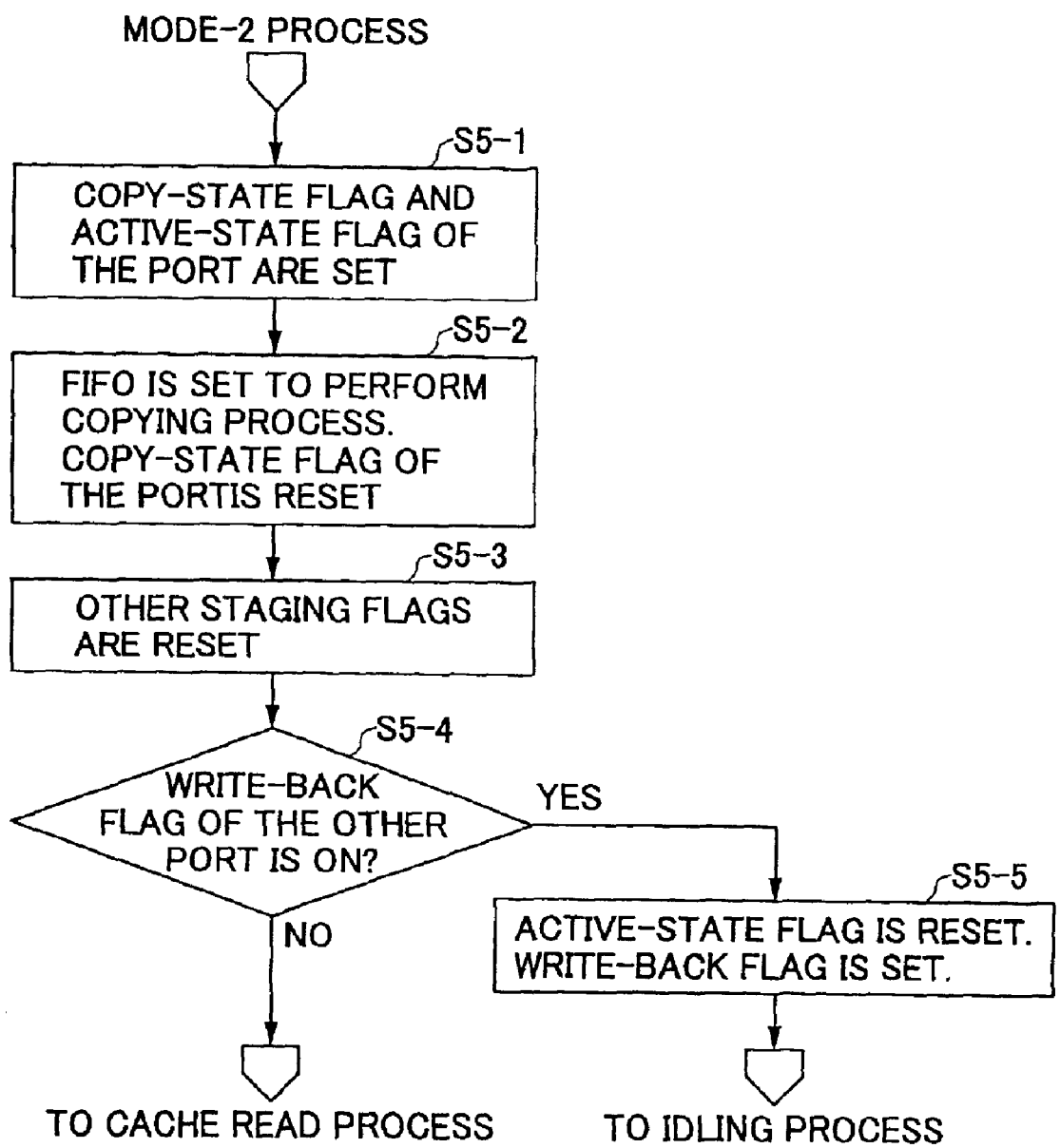
FIG. 16 is a flowchart for explaining a mode-2 process performed by the interface device of the present embodiment.

FIG. 16 shows a mode-2 process performed by the interface device of the present embodiment.

Apart from the mode-1 process described above, during the mode-2 process, the data transfer between the buffer memory 403 and the buffer memory 404 is allowed. In the mode-2 process, the cache processing of the computer A and the cache processing of the computer B with the hard disk 11 are performed such that the data stored in the buffer memory A and the data stored in the buffer memory B are set to be identical to each other by performing the data transfer between the buffer memory 403 and the buffer memory 404.

As shown in FIG. 16, at a start of the process, the interface device 400 sets the copy-state flag and the active-state flag of the channel A in ON state ("1") (S5-1). After the step S5-1 is performed, the interface device 400 sets the FIFO 407 (or the FIFO 408) to perform the copying operation, and causes the stored data of the buffer memory 403 for the channel A to be copied to the FIFO 407 (or the FIFO 408) (S5-2). After the step S5-2 is performed, the interface device 400 resets the staging flag of the channel B to OFF state (S5-3).

After the step S5-3 is performed, the interface device 400 determines whether the other write-back flag is in ON state (S5-4). When the result at the step S5-4 is affirmative (the other write-back flag ON), the interface device 400 resets the active-state flag of the channel A to OFF state and sets the write-back flag of the channel A in ON state (S5-5). After the step S5-5 is performed, the control of the interface device 400 is transferred to the idling process, and then the process for the channel A of the interface device 400 is set in the idle state.

On the other hand, when the result at the step S5-4 is negative (the other write-back flag OFF), the control of the interface device 400 is transferred to the cache reading process (the step S2-13). In the cache reading process, the interface device 400 causes the stored data of the buffer memory 403 for the channel A to be transferred to the command source.

When the interface device 400 is set to perform the mode-2 process, the interface device 40 is separately requested to perform a scanning process. The scanning process is executed by the interface device during the idle time when the interface device 400 is in the idle state.

Figure 17:
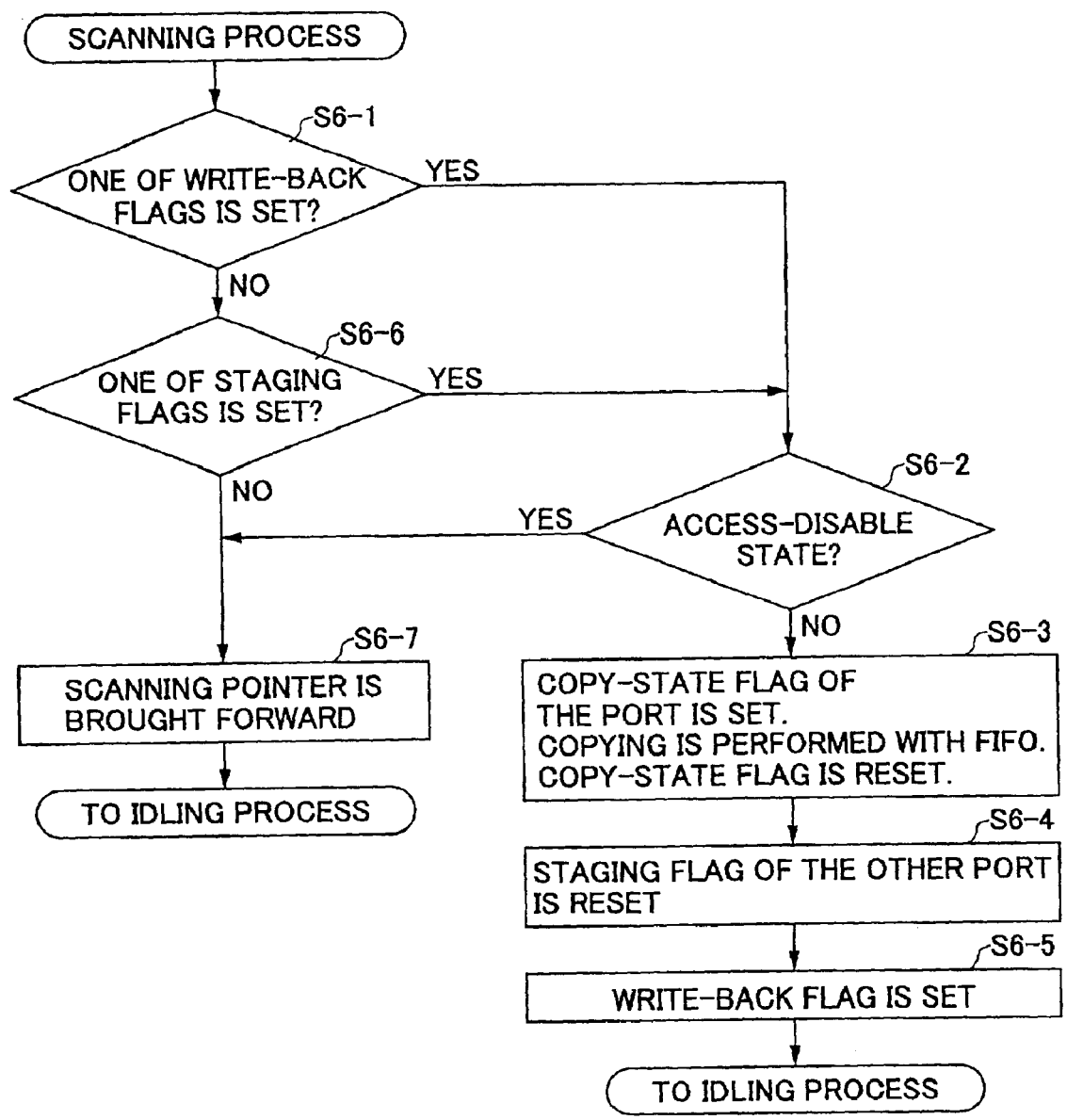
FIG. 17 is a flowchart for explaining a scanning process performed by the interface device of the present embodiment.

FIG. 17 shows a scanning process performed by the interface device of the present embodiment.

As shown in FIG. 17, at a start of the process, the interface device 400 determines whether one of the write-back flags of the channels A and B is set in ON state (S6-1). When the result at the step S6-1 is affirmative, the interface device 400 determines whether the access-disable flag of the other channel is set in ON state (S6-2). When the result at the step S6-2 is negative (the access-disable flag of the other channel is OFF), the interface device 400 sets the copy-state flag of the channel A in ON state, causes the FIFO 407 (or the FIFO 408) to store the data from the buffer memory 403, and resets the copy-state flag of the channel A to OFF state (S6-3).

After the step S6-3 is performed, the interface device 400 resets the staging flag of the channel B to OFF state (S6-4). After the step S6-4 is performed, the interface device 400 sets the write-back flag of the channel A in ON state (S6-5). After the step S6-5 is performed, the control of the interface device 400 is transferred to the idling process, and then the process for the channel A of the interface device 400 is set in the idle state.

When the result at the step S6-1 is negative (the write-back flag of the channel A OFF), the interface device 400 determines whether the staging flag of the channel A or the staging flag of the channel B is set in ON state (S6-6). When the result at the step S6-6 is affirmative (the staging flag of the channel A or B is ON), the interface device 400 performs the above step S6-2 and the subsequent steps S6-3 to S6-5. When the result at the step S6-6 is negative (the staging flags of the channels A and B are OFF), the interface device 400 brings the scanning pointer forward (S6-7). After the step S6-7 is performed, the control of the interface device 400 is transferred to the idling process, and then the process for the channel A of the interface device 400 is set in the idle state.

Figure 18:
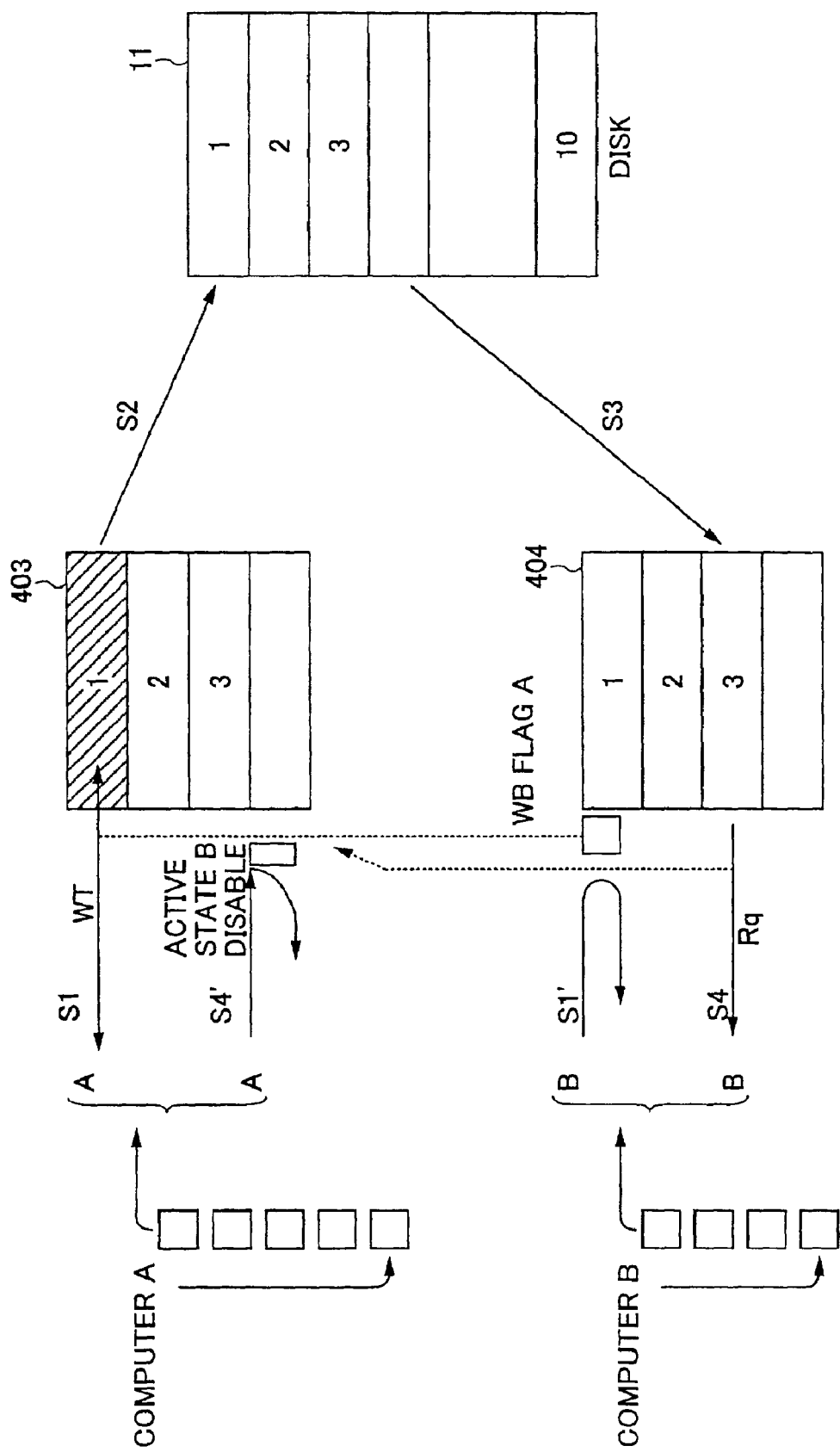
FIG. 18 is a diagram for explaining operation of the interface device of the present embodiment.

FIG. 18 is a diagram for explaining operation of the interface device of the present embodiment.

As indicated by the arrow "S1" in FIG. 18, the interface device 400 of the present embodiment stores the writing data into the buffer memory 403 via the channel A in response to the write command "WT" received from the computer A. At this time, as indicated by the arrow "S1'" in FIG. 18, the interface device 400 sets the write-back flag of the channel A in ON state, thereby the receiving of the command from the computer B at the interface device 400 is inhibited.

As indicated by the arrow "S2" in FIG. 18, the interface device 400 transfers the stored data of the buffer memory 403 to the hard disk 11 so that the writing data is recorded in the hard disk 11. After this step is performed, the interface device 400 resets the write-back flag of the channel A to OFF state. After the write-back flag of the channel A is reset, the interface device 400 causes the buffer memory 404 to receive the read-out data from the hard disk 11 in response to the read command received from the computer B, as indicated by the arrow "S3" in FIG. 18. The interface device 400 transfers the stored data of the buffer memory 404 to the computer B (which the command source of the read command) as indicated by the arrow "S4" in FIG. 18. At this time, as indicated by the arrow "S4'" in FIG. 18, the interface device 400 sets the active-state flag of the channel B in ON state, thereby the receiving of the command from the computer A at the interface device 400 is inhibited.

According to the above-described embodiment, when the data transfer between the buffer memory of one of the channels A and B and the hard disk 11 (or the command source) is in process, the receiving of the access request of the other channel from the other computer at the interface device 400 is inhibited. The interface device 400 of the present embodiment is effective in preventing the duplicate data processing of the buffer memories of the channels A and B for the same area of the hard disk 11, which will damage the contents of the buffer memories in the interface device 400.

Figure 19:
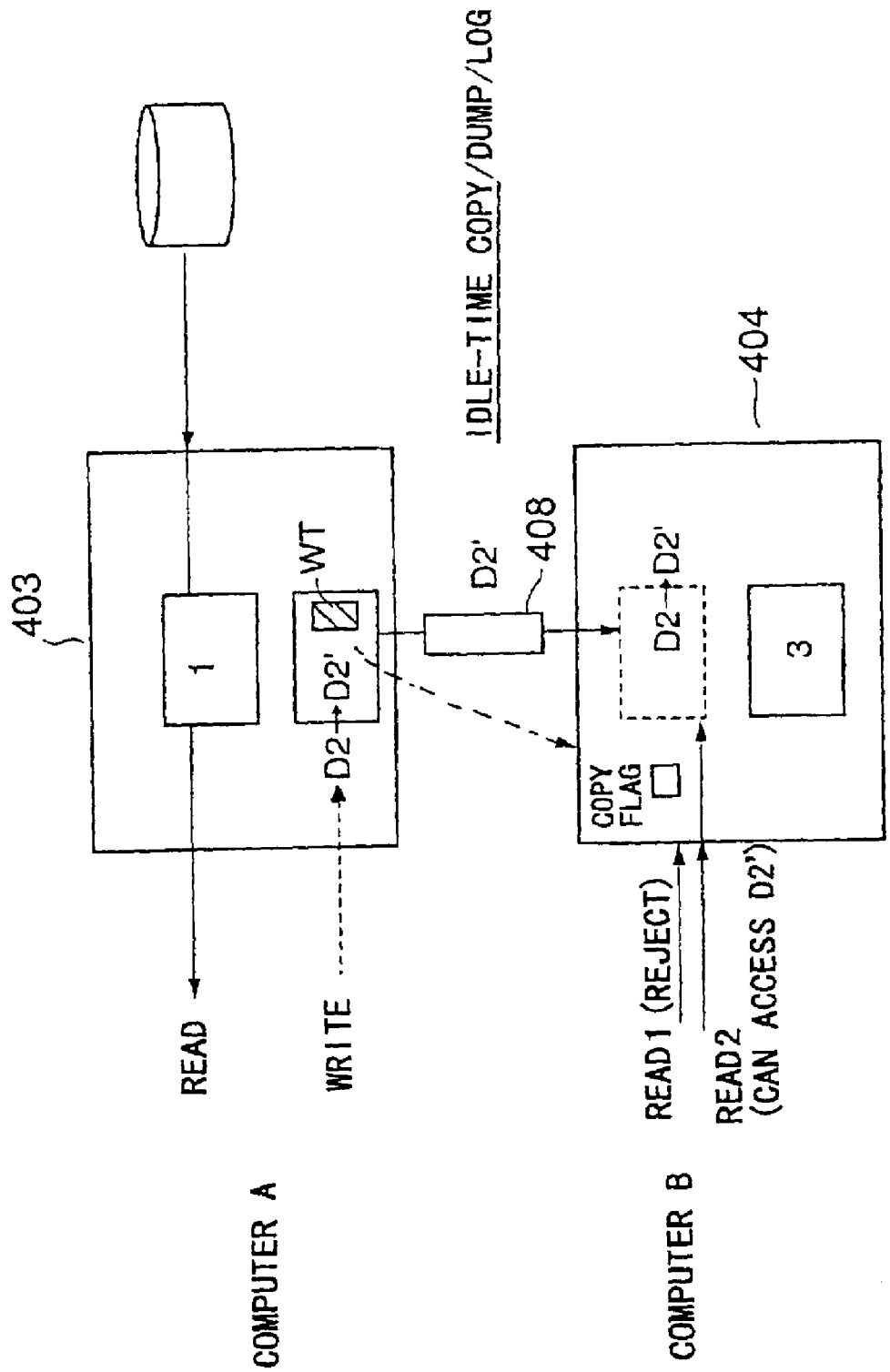
FIG. 19 is a diagram for explaining operation of the interface device of the present embodiment during the mode-2 process.

FIG. 19 is a diagram for explaining operation of the interface device of the present embodiment during the mode-2 process.

As described earlier, during the mode-2 process, the data transfer between the buffer memory 403 and the buffer memory 404 is allowed. In the mode-2 process, the cache processing of the computer A and the cache processing of the computer B with the hard disk 11 are performed such that the data stored in the buffer memory 403 and the data stored in the buffer memory 404 are set to be identical to each other by performing the data transfer between the buffer memory 403 and the buffer memory 404.

As shown in FIG. 19, during the mode-2 process, the data "D2" of the buffer memory 403 is renewed to data "D2'" by performing the writing operation in response to the write command on the channel A. At this time, the stored data "D2'" of the buffer memory 403 is transferred to the buffer memory 404 through the FIFO 408 during the idle time when the interface device 400 is in the idle state, so that the data "D2" of the buffer memory 404 is also renewed to the data "D2'". Hence, the data stored in the buffer memory 403 and the data stored in the buffer memory 404 are set to be identical to each other with respect to the same data of the hard disk 11 by performing the data transfer between the buffer memory 403 and the buffer memory 404 directly through the FIFO 407 or the FIFO 408.

When a command of the computer B to access the data "D2" of the buffer memory 404 is rejected at the interface device 400 during the data transfer mentioned above, the execution of the received command is deferred until the data "D2" of the buffer memory 404 is renewed to the data "D2'" through the above data transfer between the buffer memory 403 and the buffer memory 404. After the data stored in the buffer memory 403 and the data stored in the buffer memory 404 are set to be identical to each other, the execution of the command of the computer B is allowed.

In the interface device 400 of the present embodiment, the data stored in the buffer memories of different channels are set to be identical with respect to the same data of the hard disk 11, and it is possible to directly access the stored data of the buffer memories 403 and 404. Hence, the interface device 400 of the present embodiment is effective in increasing the efficiency of performing data input/output operations in a hard disk drive, and it is not affected by the data transfer capacity of any of the buffer memories.

In the above-described embodiment, the respective processes are performed with respect to each of the individual channels, and there is the possibility that the processes of different channels cause the flags of the both channels to be set or reset at the same time. The data management table 406 is provided in the interface device 400 of the present embodiment in order to avoid the current accessing of such flags. Namely, when the flag of one of the channels A and B is set in ON state, the flag of the other channel is reset to OFF state. The commands from the computers for each of the different channels are linked to a single command queue in order of the arrival at the interface device 400.

In the above-described embodiment, the interface device 400 includes only two channels, for the sake of simplicity of description. The present invention is not limited to this embodiment. Alternatively, the interface device 400 may include three or more channels. In such alternative embodiment, the buffer memory is provided for each of the respective channels, and the stored data of the respective buffer memories are set to be identical, so that the interface device of the alternative embodiment achieves the functions and effects of the above-described embodiment.

In the above-described embodiments of the present invention, the data processing device, the signal processing device and the interface device are applied to the hard disk drive. However, the present invention is not limited to these embodiments, and variations and modifications may be made without departing from the scope of the present invention.

Further, the present invention is based on Japanese priority application No. 2001-059283, filed on Mar. 2, 2001, the entire contents of which are hereby incorporated by reference.

What is claimed is:

1. A data processing device in which a processor processes data based on a stored program and a buffer manager accesses the data, comprising:

a program memory storing program codes, the program codes being loaded into a program memory and executed by the processor when processing the data;

a shared memory storing one of the program codes and the data; and a control unit selecting one of a connecting line between the processor and the shared memory and a connecting line between the buffer manager and the shared memory in response to a select pattern register which is set in one of first and second conditions, wherein the processor, the buffer manager, the program memory, and the shared memory are interconnected by an internal bus, the shared memory functions to store the program codes when the select pattern register is set in the first condition, and the shared memory functions to store the data when the select pattern register is set in the second condition.

2. The data processing device according to claim 1, wherein the control unit comprises a register and a multiplexer, the select pattern being input to the register, and the multiplexer selectively connecting one of a first connecting line and a second connecting line to the shared memory in response to the select pattern input to the register.

3. The data processing device according to claim 1, wherein, when the stored program includes a large amount of program codes exceeding a storage capacity of the program memory, both the program memory and the shared memory function to store the program codes and an externally attached buffer memory is used to store the data, and when the stored program includes a small amount of program codes, only the program memory functions to store the program codes and the shared memory functions to store the data.

4. An interface device which performs data input/output operations through a plurality of channels, comprising:

a plurality of buffer memories including a first memory buffer and a second memory buffer, each buffer memory provided for a particular one of the plurality of channels; and a control unit controlling the data input/output operations for each of the plurality of buffer memories such that data stored in the first buffer memory and data stored in the second buffer memory are set to be identical to each other by performing data transfer between the first buffer memory and the second buffer memory, wherein, when a first data of the first buffer memory for one of the plurality of channels is renewed to a second data, the control unit transfers the second data of the first buffer memory to the second buffer memory for another channel through a data buffer during a time the interface device is in an idle state.

5. The interface device according to claim 4, wherein the control unit comprises a data management table which provides correlations between locations of respective data stored in the plurality of buffer memories and locations of data stored in a recording medium, respective states of the stored data in the plurality of buffer memories being managed by the control unit.

6. The interface device according to claim 5, wherein, when the stored data of one of the buffer memories is updated through one of the channels, the control unit sets the state of another channel in an access-disable state by using the data management table, thereby inhibiting receiving of a command at the interface device via said another channel.

7. The interface device according to claim 4, wherein, when the data transferring is performed to the second buffer memory for said another channel, the control unit sets the state of said another channel in an access-disable state by using the data management table, thereby inhibiting receiving of a command at the interface device with respect to said another channel.

* * * * *